(12) United States Patent
Fujimura et al.

(10) Patent No.: US 12,310,020 B2
(45) Date of Patent: May 20, 2025

(54) THREE-DIMENSIONAL MEMORY DEVICE INCLUDING A DUMMY WORD LINE WITH TAPERED CORNER AND METHOD OF MAKING THE SAME

(71) Applicant: SANDISK TECHNOLOGIES LLC, Addison, TX (US)

(72) Inventors: Nobuyuki Fujimura, Yokkaichi (JP); Shunsuke Takuma, Yokkaichi (JP); Takashi Kudo, Yokkaichi (JP); Satoshi Shimizu, Yokkaichi (JP); Zhixin Cui, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 541 days.

(21) Appl. No.: 17/715,662

(22) Filed: Apr. 7, 2022

(65) Prior Publication Data
US 2023/0328981 A1    Oct. 12, 2023

(51) Int. Cl.
| | | |
|---|---|---|
| *H10B 43/27* | (2023.01) | |
| *H10B 41/10* | (2023.01) | |
| *H10B 41/27* | (2023.01) | |
| *H10B 41/35* | (2023.01) | |
| *H10B 41/40* | (2023.01) | |
| *H10B 43/10* | (2023.01) | |

(Continued)

(52) U.S. Cl.
CPC ............. *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 43/10; H10B 43/35; H10B 43/40; H10B 41/10; H10B 41/27; H10B 41/35; H10B 41/40
See application file for complete search history.

(56) References Cited

U.S. PATENT DOCUMENTS

| | | |
|---|---|---|
| 9,768,192 B1 | 9/2017 | Nakamura |
| 9,780,034 B1 | 10/2017 | Tsutsumi et al. |
| (Continued) | | |

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Sitaramarao S Yechuri
(74) *Attorney, Agent, or Firm* — THE MARBURY LAW GROUP PLLC

(57) ABSTRACT

A memory device includes a first alternating stack of first insulating layers and first electrically conductive layers located over a substrate, a memory opening vertically extending through the first alternating stack and having a tapered sidewall surface at a level of one of the first electrically conductive layers, and a memory opening fill structure located in the memory opening and comprising a vertical stack of memory elements and a vertical semiconductor channel. One of the first electrically conductive layers includes a taper-containing electrically conductive layer that is located at a level of the lateral protrusion of the memory opening and has a contoured sidewall having a tapered sidewall segment that is parallel to the tapered sidewall surface of the lateral protrusion.

6 Claims, 45 Drawing Sheets

(51) Int. Cl.
*H10B 43/35* (2023.01)
*H10B 43/40* (2023.01)

(56) References Cited

U.S. PATENT DOCUMENTS

| | | | |
|---|---|---|---|
| 9,991,280 B2 | 6/2018 | Nakamura et al. | |
| 10,056,399 B2 | 8/2018 | Costa et al. | |
| 10,242,994 B2 | 3/2019 | Inomata et al. | |
| 10,256,252 B1* | 4/2019 | Kanazawa | H01L 29/40117 |
| 10,381,434 B1 | 8/2019 | Pachamuthu et al. | |
| 10,475,879 B1 | 11/2019 | Pachamuthu et al. | |
| 10,600,802 B2 | 3/2020 | Nakamura et al. | |
| 10,658,377 B2 | 5/2020 | Kubo et al. | |
| 10,748,925 B1 | 8/2020 | Tsutsumi et al. | |
| 10,964,715 B2 | 3/2021 | Kakazu et al. | |
| 11,296,101 B2 | 4/2022 | Lee et al. | |
| 2018/0331117 A1* | 11/2018 | Titus | H10B 43/27 |
| 2020/0006373 A1* | 1/2020 | Kubo | H10B 43/27 |
| 2020/0388631 A1 | 12/2020 | Bin et al. | |
| 2021/0151452 A1 | 5/2021 | Cheon et al. | |
| 2021/0159149 A1 | 5/2021 | Kitazawa et al. | |
| 2021/0249261 A1* | 8/2021 | Hopkins | H01L 21/02164 |
| 2023/0011135 A1* | 1/2023 | Hopkins | H01L 29/42328 |

OTHER PUBLICATIONS

U.S. Appl. No. 17/166,357, filed Feb. 3, 2021, Sandisk Technologies LLC.
U.S. Appl. No. 17/169,987, filed Feb. 8, 2021, Sandisk Technologies LLC.
U.S. Appl. No. 17/189,153, filed Mar. 1, 2021, Sandisk Technologies LLC.
U.S. Appl. No. 17/510,807, filed Oct. 26, 2021, Sandisk Technologies LLC.
USPTO Office Communication, Non-Final Office Action for U.S. Appl. No. 18/060,732, mailed Nov. 21, 2024, 17 pages.

* cited by examiner

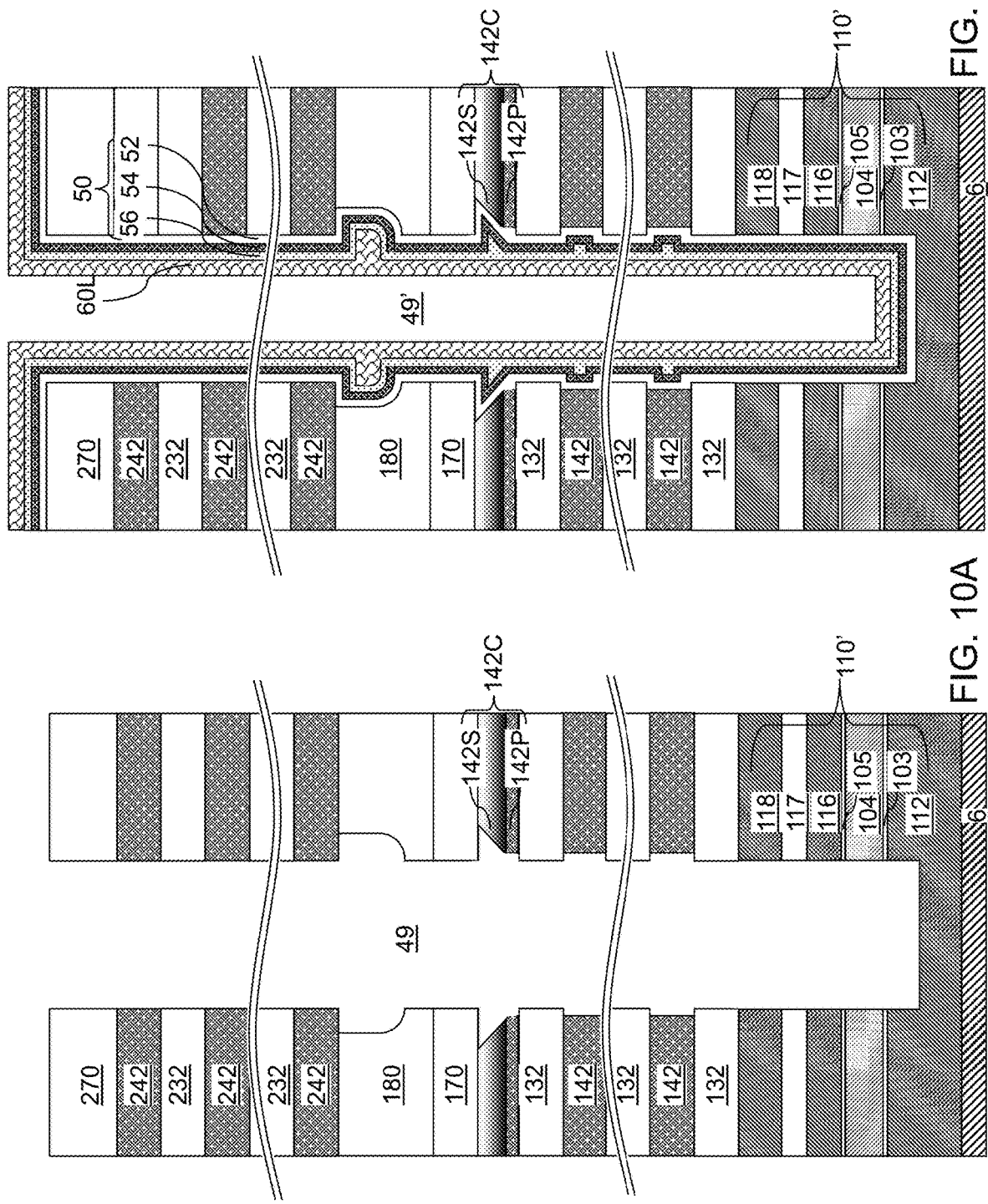

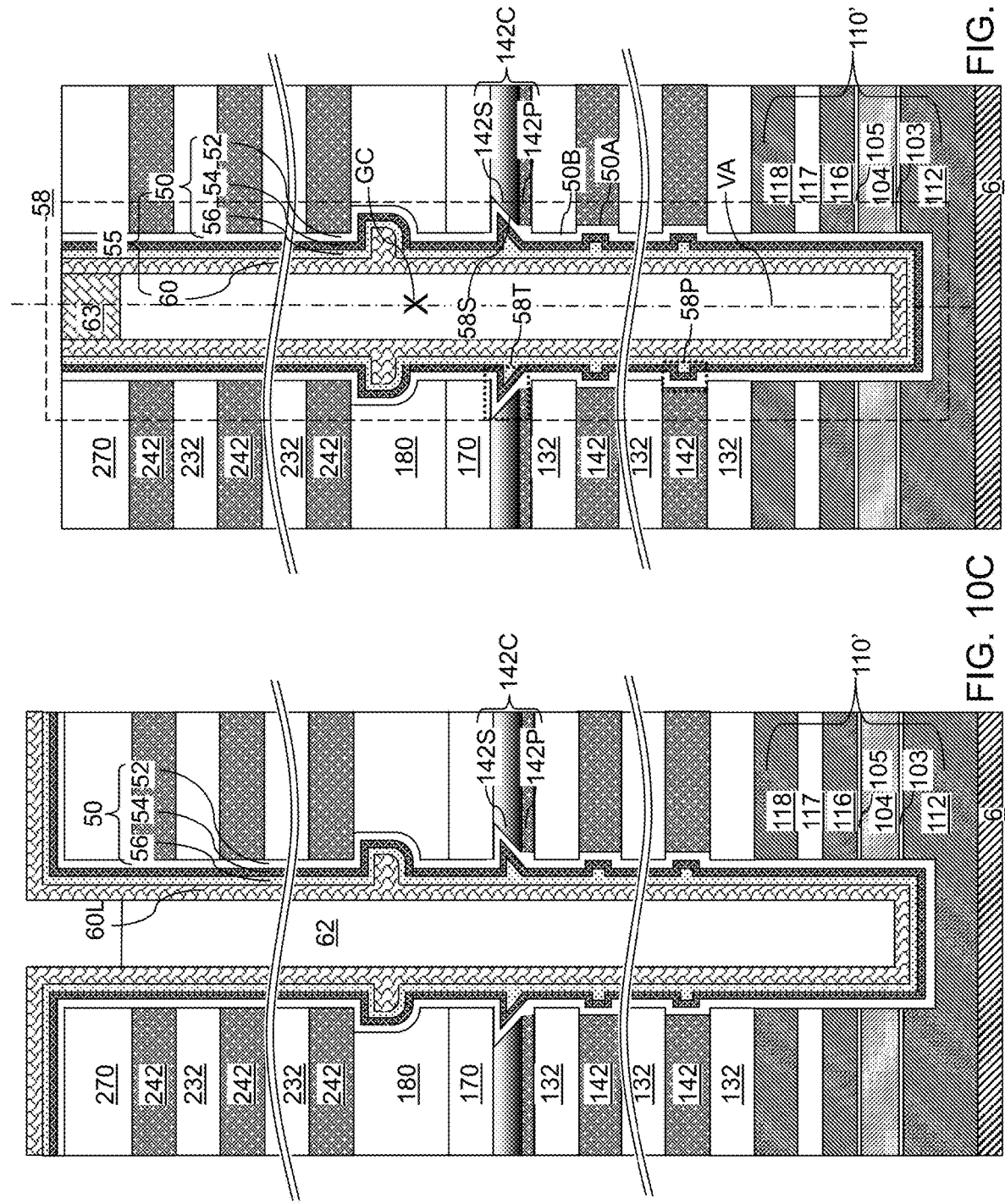

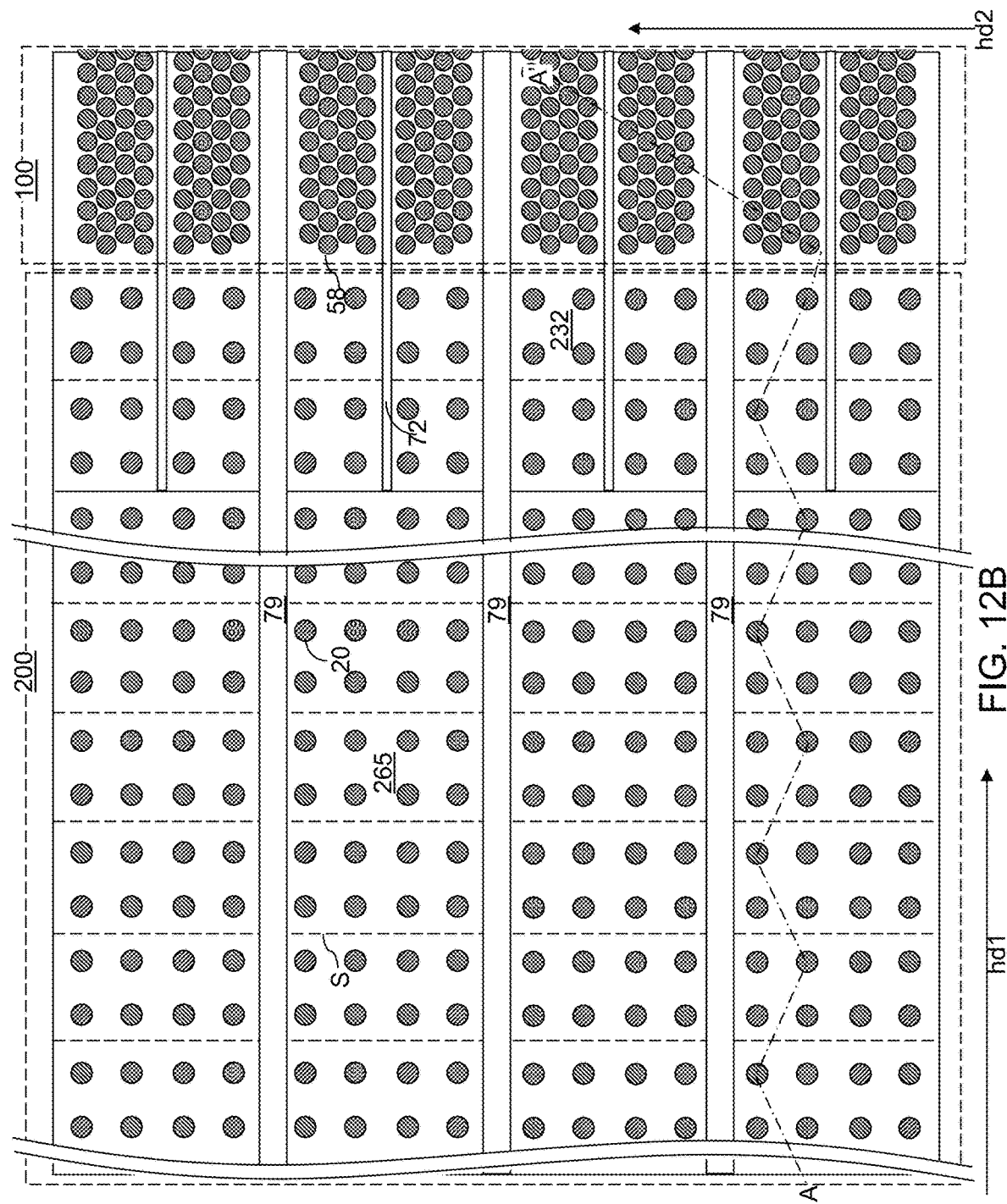

THREE-DIMENSIONAL MEMORY DEVICE INCLUDING A DUMMY WORD LINE WITH TAPERED CORNER AND METHOD OF MAKING THE SAME

FIELD

The present disclosure relates generally to the field of semiconductor devices, and particularly to a three-dimensional memory device including a dummy word line with tapered corner and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: a first alternating stack of first insulating layers and first electrically conductive layers; a memory opening vertically extending through the first alternating stack; and a memory opening fill structure located in the memory opening and comprising a vertical stack of memory elements and a vertical semiconductor channel, wherein the memory opening fill structure comprises a lateral protrusion having a tapered sidewall surface; and wherein one of the first electrically conductive layers comprises a taper-containing electrically conductive layer that is located at a level of the lateral protrusion of the memory opening fill structure and comprises a contoured sidewall having a tapered sidewall segment that is parallel to the tapered sidewall surface of the lateral protrusion.

According to another aspect of the present disclosure, a method of forming a memory device is provided, which comprises: forming a first alternating stack of first insulating layers and first sacrificial material layers located over a substrate, wherein one of the first sacrificial material layers comprises a composite sacrificial material layer including a primary sacrificial material sublayer including a first sacrificial material and a secondary sacrificial material sublayer including a second sacrificial material that is different from the first sacrificial material; forming a first-tier memory opening through the first alternating stack; performing an isotropic recess etch process that isotropically etches the second sacrificial material at a higher average etch rate than the first sacrificial material, wherein a recessed sidewall of the composite sacrificial material layer comprises a tapered recessed surface segment; and forming a memory opening fill structure within a volume including the first-tier memory opening, wherein the memory opening fill structure comprises a vertical stack of memory elements and a vertical semiconductor channel, and comprises a lateral protrusion having a tapered sidewall surface that is parallel to the tapered recessed surface segment.

BRIEF DESCRIPTION OF THE DRAWINGS

FIGS. 10A-10D illustrate sequential vertical cross-sectional views of a memory opening during formation of a memory opening fill structure according to an embodiment of the present disclosure.

FIG. 12B is a horizontal cross-sectional view of the exemplary structure along the horizontal plane B-B' of FIG. 12A. The hinged vertical plane A-A' corresponds to the plane of the vertical cross-sectional view of FIG. 12A.

DETAILED DESCRIPTION

Figure 1A:
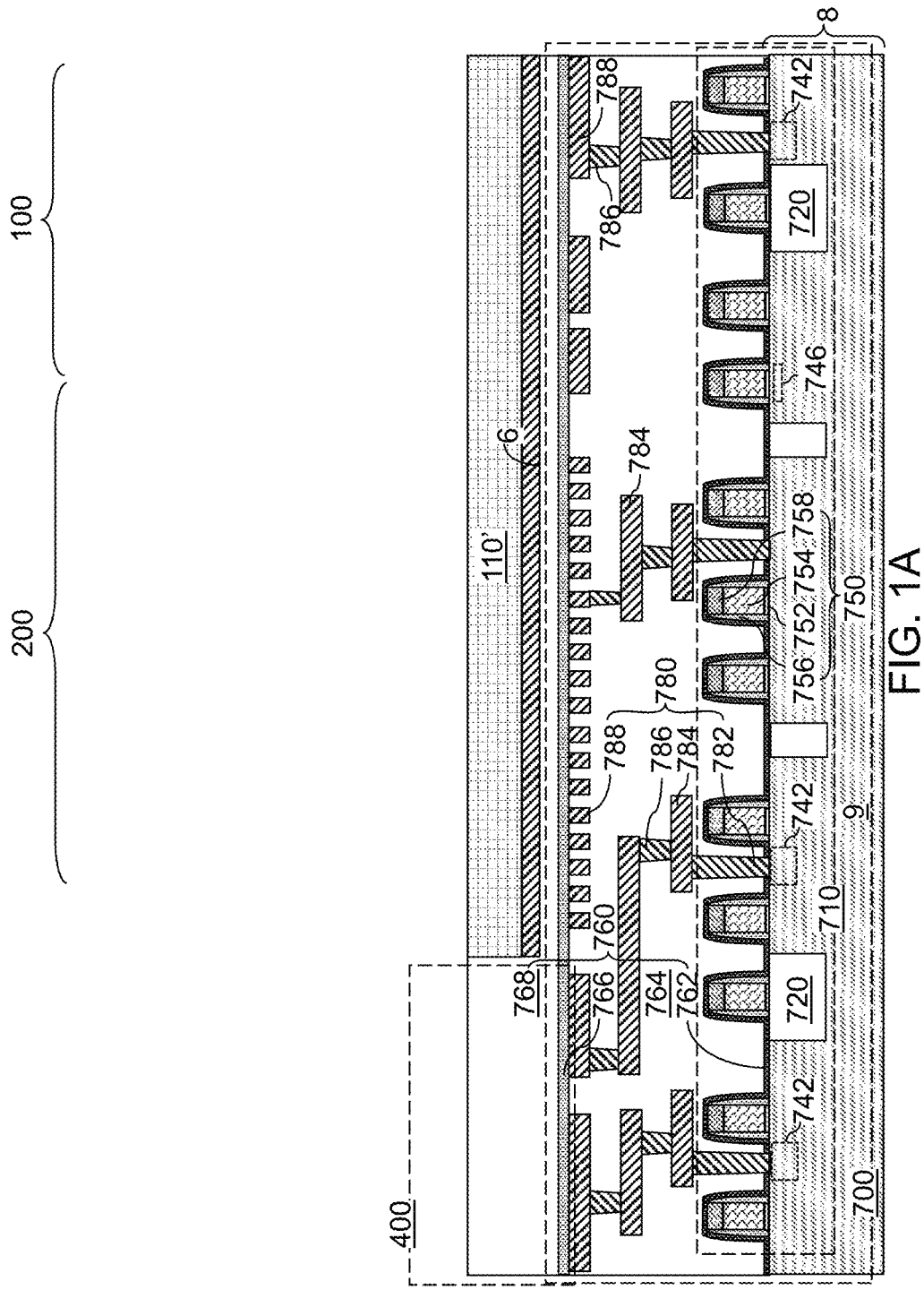
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

Embodiments of the present disclosure provide a three-dimensional memory device including a dummy word line having a tapered corner and methods of manufacturing the same, the various aspects of which are described herein in detail. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
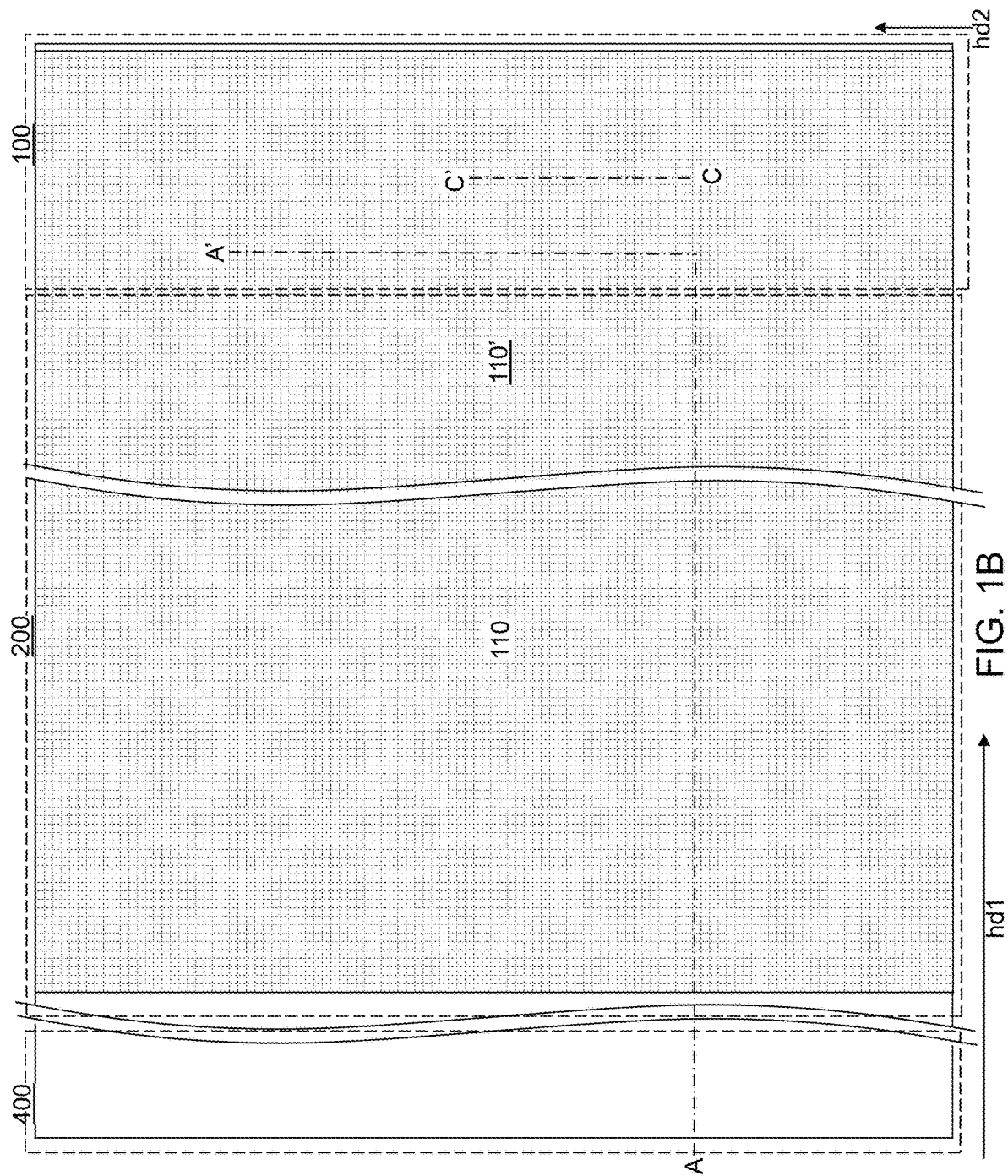
FIG. 1B is a top-down view of the exemplary structure of FIG. 1A. The hinged vertical plane A-A' is the plane of the vertical cross-sectional view of FIG. 1A.
Figure 1C:
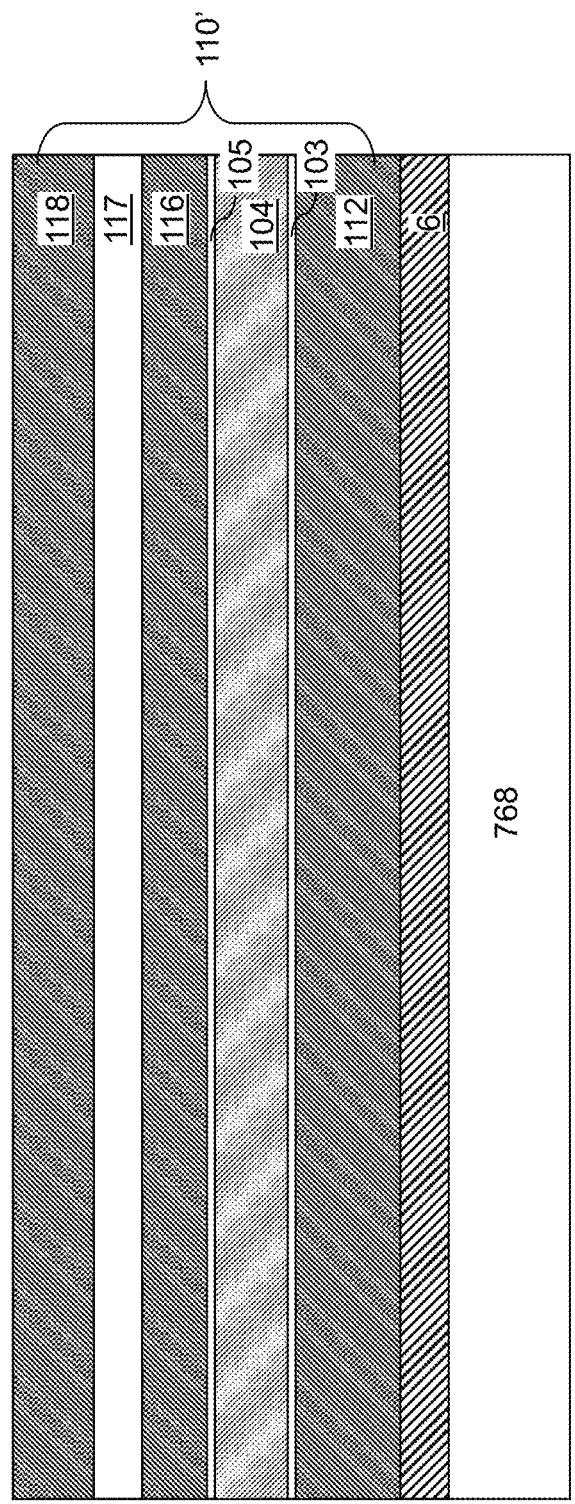
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

In an alternative embodiment, the underlying peripheral device region 700, the optional conductive plate layer 6 and/or the in-process source-level material layers 110' may be omitted. Instead, the peripheral device region 700 may be located on a separate substrate which is subsequently bonded to the memory array region 100.

Figure 2:
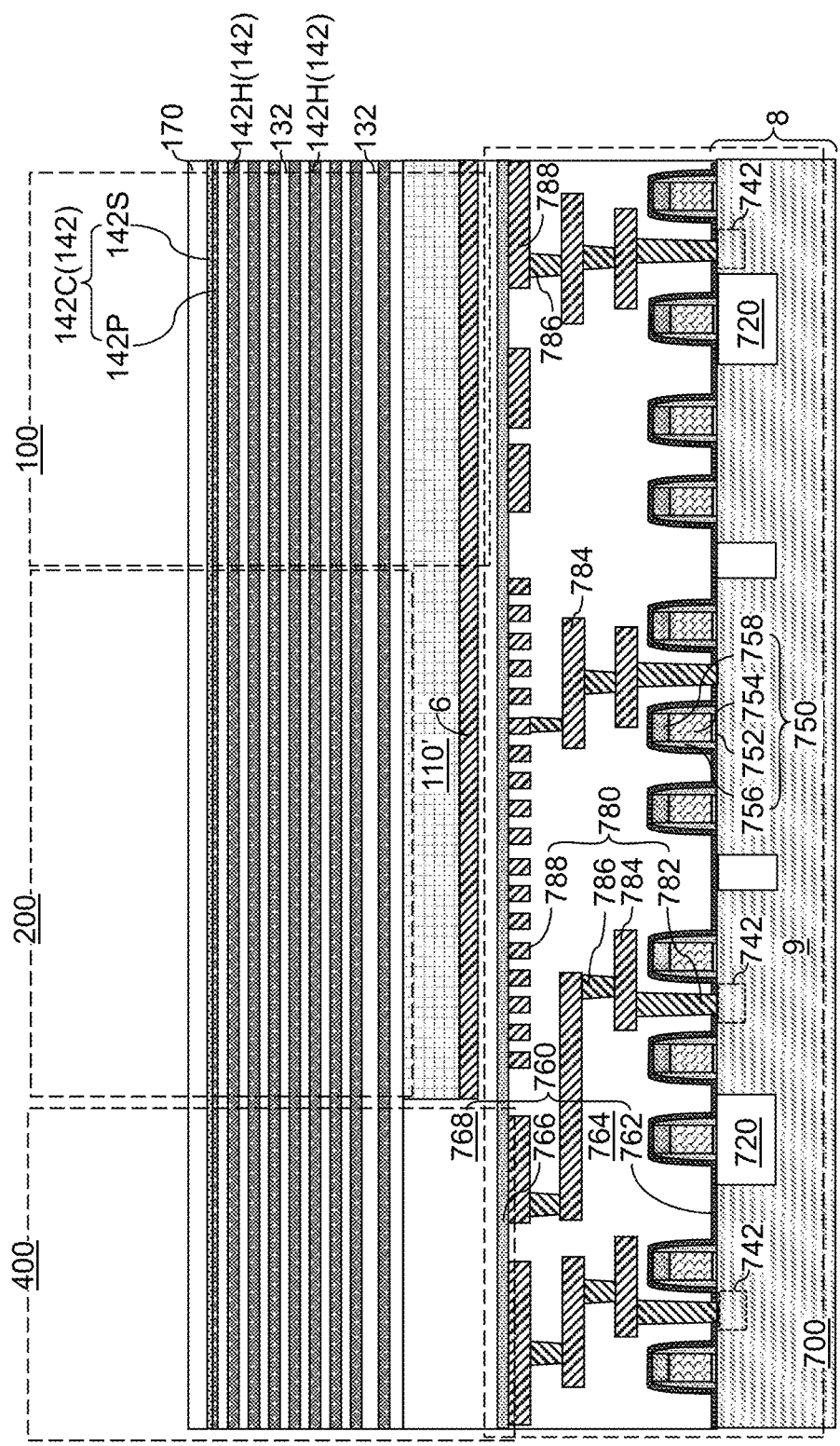
FIG. 2 is a vertical cross-sectional view of the exemplary structure after formation of a first alternating stack of first insulting layers and first sacrificial material layers according to an embodiment of the present disclosure.

Referring to FIG. 2, a first alternating stack of first insulting layers 132 and first sacrificial material layers 142 can be formed over the substrate 8 (e.g., over the in-process source-level material layers 110', if present). The first insulating layers 132 comprise, and/or consist essentially of, an insulating material, such as undoped silicate glass (i.e. silicon oxide), a doped silicate glass, or organosilicate glass. According to an aspect of the present disclosure, the first sacrificial material layers 142 comprise a composite sacrificial material layer 142C and homogeneous sacrificial material layers 142H. The composite sacrificial material layer 142C may be a topmost first sacrificial material layer of the set of all first sacrificial material layers 142. The homogeneous sacrificial material layers 142H may comprise the remainder of the first sacrificial material layers 142 excluding the composite sacrificial material layer 142C. Thus, the homogeneous sacrificial material layers 142H are located underneath the composite sacrificial material layer 142C.

In one embodiment, the homogeneous sacrificial material layers 142H are composed of and/or consist essentially of a first sacrificial material. The composite sacrificial material layer 142C comprises a layer stack including a primary sacrificial material sublayer 142P and a secondary sacrificial material sublayer 142S. As used herein, a "sublayer" refers to a component layer of a layer that includes a contiguous set of two or more component layers (i.e., two or more sublayers). In one embodiment, the primary sacrificial material sublayer 142P comprises and/or consists essentially of, the first sacrificial material and the secondary sacrificial material sublayer 142S comprises and/or consists essentially of a second sacrificial material that has a higher etching rate than the first sacrificial material. The first sacrificial material and the second sacrificial material are materials that may be removed selective to the insulating material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In one embodiment, the primary sacrificial material sublayer 142P underlies the secondary sacrificial material sublayer 142S. The thickness of each homogeneous sacrificial material layer 142H may be in a range from 20 nm to 60 nm, although lesser and greater thicknesses may also be employed. In one embodiment, the thickness of each homogeneous sacrificial material layer 142H may be the same. In one embodiment, the thickness of the composite sacrificial material layer 142C may be the same as, or may be substantially the same as, the thickness of each homogeneous sacrificial material layer 142H. In one embodiment, the thickness of the primary sacrificial material sublayer 142P may be in a range from 10% to 90%, such as from 25% to 75%, of the thickness of the composite sacrificial material layer 142C. In one embodiment, the thickness of the secondary sacrificial material sublayer 142S may be in a range from 10% to 90%, such as from 25% to 75%, of the thickness of the primary sacrificial material sublayer 142P.

According to an aspect of the present disclosure, the first sacrificial material and the second sacrificial material are selected such that the second sacrificial material may be removed faster than the first sacrificial material in a subsequent isotropic etch process that is selective to the insulating material of the first insulating layers 132. In one embodiment, the second sacrificial material may have a vertical compositional gradient such that the etch rate of the second sacrificial material in the subsequent anisotropic etch process increases with a vertical distance from the substrate 8. The ratio of the average etch rate of the second sacrificial material to the etch rate of the first sacrificial material in the subsequent isotropic etch process may be in a range from 1.2 to 10, such as from 1.5 to 5, although lesser and greater ratios may also be employed. The ratio of the average etch rate of the first sacrificial material to the etch rate of the insulating material of the first insulating layers 132 in the subsequent isotropic etch process may be in a range from 2.0 to 10,000, such as from 10 to 1,000, although greater ratios may also be employed.

In an illustrative example, the first insulating layers 132 may consist essentially of silicon oxide, the homogeneous sacrificial material layers 142H and the first sacrificial material of the primary sacrificial material sublayer 142P comprise a first silicon nitride material, and the second sacrificial material of the secondary sacrificial material sublayer 142S comprises a second silicon nitride material having a higher etch rate in hot phosphoric acid than the etch rate of the first sacrificial material in the hot phosphoric acid. Hot phosphoric acid refers to phosphoric acid at or near the boiling point at 1 atmospheric pressure. In one embodiment, the primary sacrificial material sublayer 142P may consist essentially of a first silicon nitride material that is stoichiometric or near-stoichiometric (i.e., $Si_3N_4$) and/or has a relatively low density, and the secondary sacrificial material sublayer 142S may consist essentially of a second silicon nitride material that is silicon rich (i.e., $Si_{3+x}N_{4-x}$, where x>0, such as 0.1<x<1) and/or a has a lower density (e.g., at least 5% lower density, such as 7 to 15% lower density) than the first silicon nitride material. Alternatively or in addition, the second silicon nitride material may include a vertical compositional (i.e., increasing Si:N ratio) and/or density gradient (i.e., decreasing density) as a function of its thickness, such that the etch rate of the second sacrificial material in a subsequent isotropic etch process increases with a vertical distance from the substrate 8, while the first silicon nitride material has a homogeneous composition and porosity as a function of its thickness.

Generally, the second silicon nitride material may be deposited in a condition that alters the material composition and/or porosity of silicon nitride to increase the etch rate in hot phosphoric acid by selecting deposition parameters (such as reactant ratios, pressure, temperature, plasma power, etc.) during the deposition process. In one embodiment, the first silicon nitride material and the second silicon nitride material may be deposited employing plasma-enhanced chemical vapor deposition (PECVD) processes having different process conditions.

For example, the first silicon nitride material may have a density in a range from 2.45 g/cm$^3$ to 2.65 g/cm$^3$. Such a low porosity silicon nitride material may be deposited by a plasma enhanced chemical vapor deposition process in which a lower plasma power is employed. In contrast, the second silicon nitride material may have a density in a range from 2.2 g/cm$^3$ to 2.35 g/cm$^3$. Such a relatively porous silicon nitride material may be deposited by a plasma enhanced chemical vapor deposition process in which a higher plasma power is employed. To form a density gradient as a function of thickness in the second silicon nitride material, the plasma power is decreased gradually or stepwise during the deposition of the second silicon nitride material.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
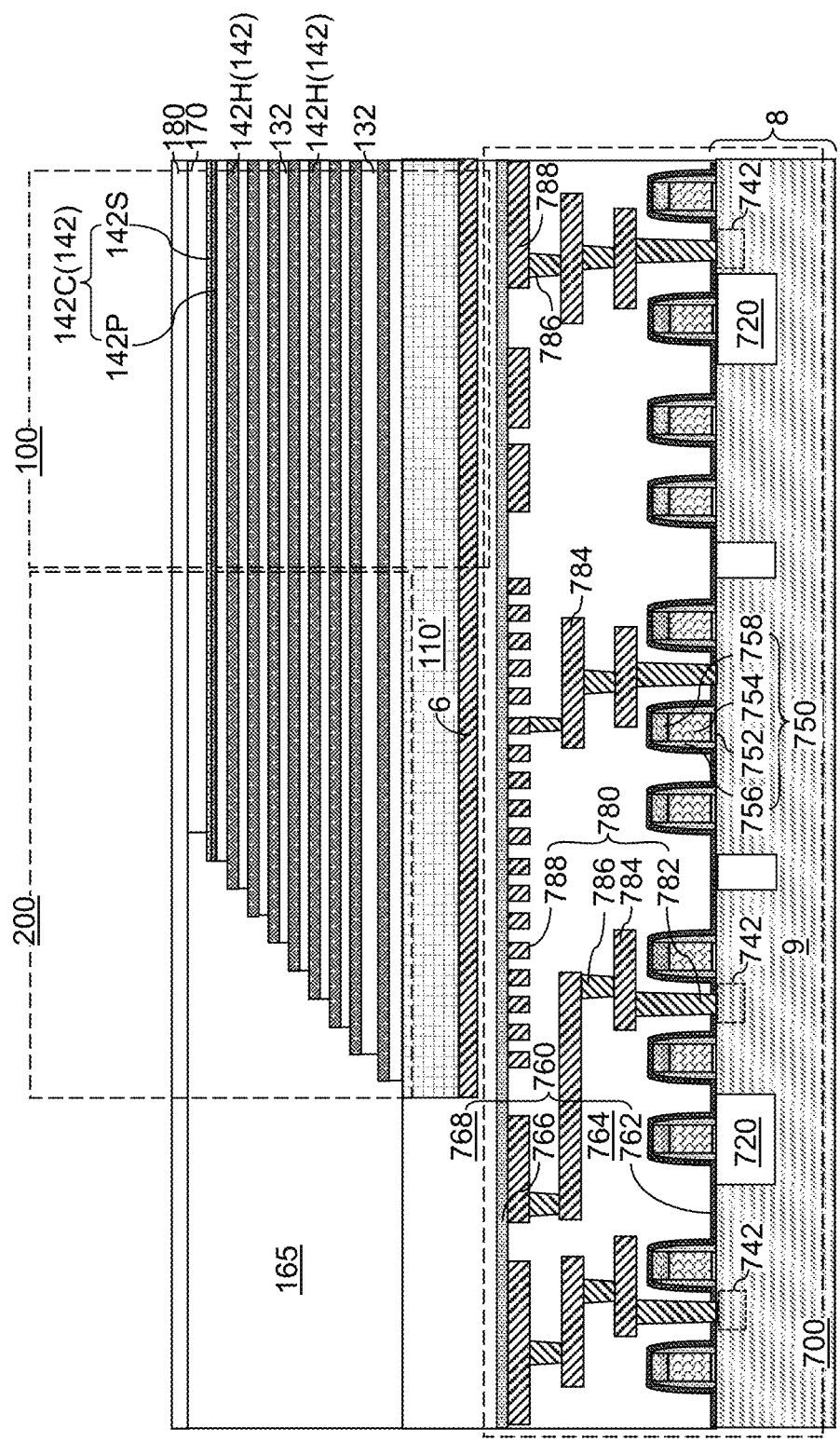
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
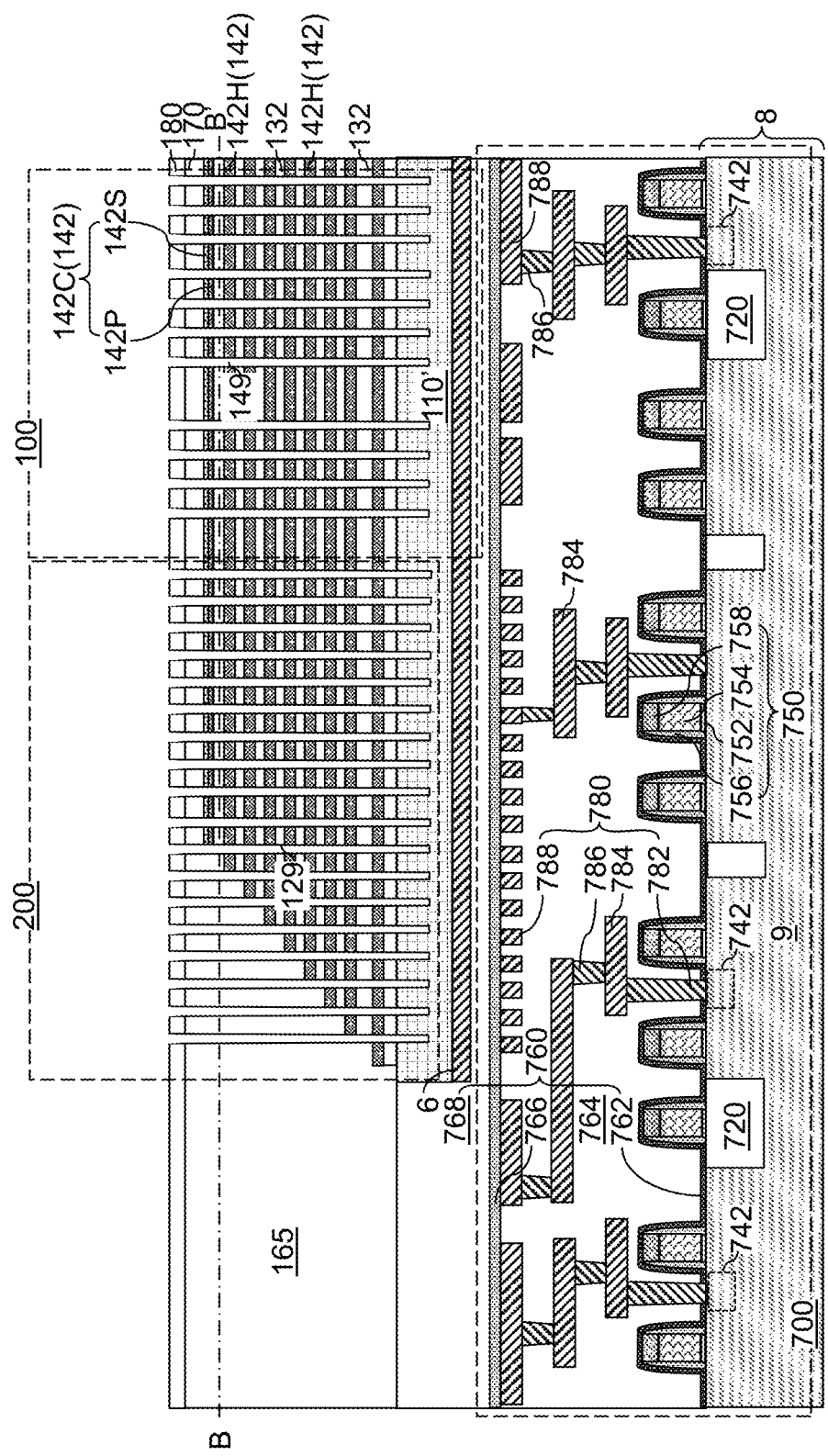
FIG. 4A is a vertical cross-sectional view of the exemplary structure after formation of first-tier memory openings and first-tier support openings according to an embodiment of the present disclosure.
Figure 4B:
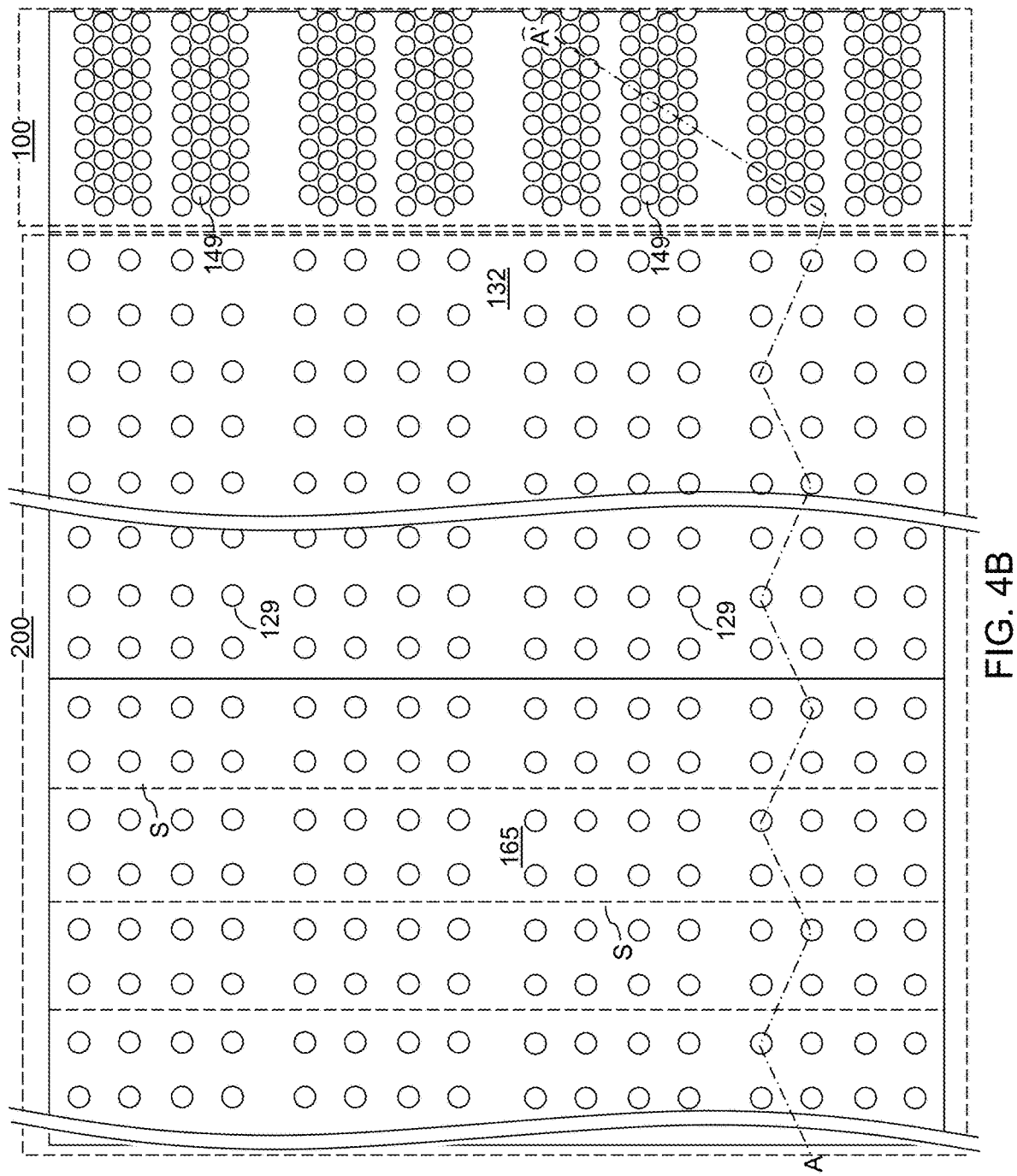
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. An etch mask layer (not shown) may be applied over the inter-tier dielectric layer 180. In one embodiment, the etch mask layer may comprise a patterned photoresist layer that can be formed by applying and lithographically patterning a photoresist material layer. The photoresist material layer may be lithographically patterned to form various openings therethrough. The pattern of openings in the patterned photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first alternating stack (132, 142) are etched concurrently with the material of the first retro-stepped dielectric material portion 165. The chemistry of the initial etch step may alternate to optimize etching of the materials in the first alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second alternating stack (to be subsequently formed prior to formation of the second-tier memory openings).

FIGS. 5A-5F are sequential vertical cross-sectional views of a first-tier memory opening during formation of a sacrificial memory opening fill structure according to an embodiment of the present disclosure.

Figures 5A, 5B:
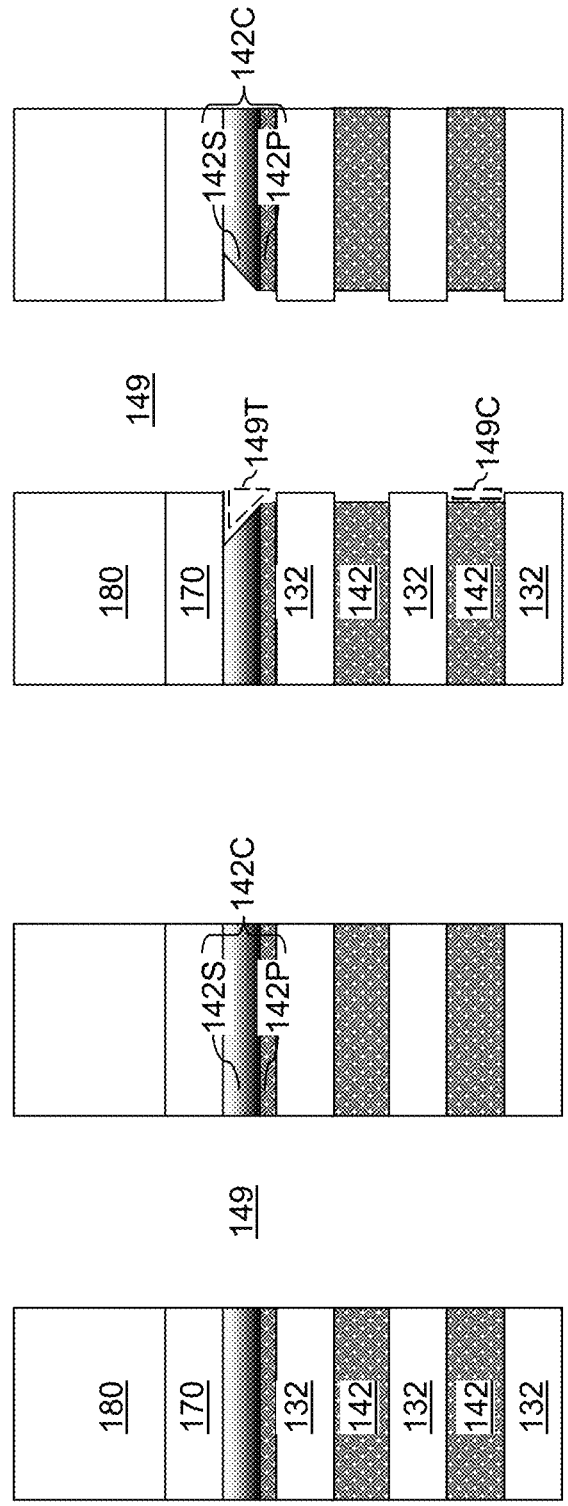
FIGS. 5A-5F are sequential vertical cross-sectional views of a first-tier memory opening during formation of a sacrificial memory opening fill structure according to an embodiment of the present disclosure.

Referring to FIG. 5A, an upper portion of a first-tier memory opening 149 in the exemplary structure of FIGS. 4A and 4B is illustrated.

Referring to FIG. 5B, an isotropic recess etch process that isotropically etches the first sacrificial material and the second sacrificial material selective to the insulating material of the first insulating layers 132 and optionally selective to the materials of the first insulating cap layer 170 and the inter-tier dielectric layer 180 can be performed. The isotropic etch rate etches the second sacrificial material at a higher average etch rate than the first sacrificial material. In one embodiment, the second sacrificial material in the secondary sacrificial material sublayer 142S may have a compositional gradient such that the etch rate of the second sacrificial material increases with a vertical distance from the substrate 8.

In an illustrative example, the second sacrificial material may have a lower density and/or a vertical compositional gradient and/or density gradient to provide a higher etch rate than the first sacrificial material. In this case, the isotropic recess etch process may comprise a wet etch process employing hot phosphoric acid, or hydrofluoric acid, or a mixture of hydrofluoric acid and ethylene glycol.

The composite sacrificial material layer 142C is patterned into a taper-containing sacrificial material layer comprising a contoured sidewall having a tapered sidewall segment. In one embodiment, the recessed sidewall of the composite sacrificial material layer 142C may comprise a tapered recessed surface segment, which may be a tapered annular surface segment of the secondary sacrificial material sublayer 142S. The tapered annular surface segment can have an inner periphery that is vertically offset from an outer periphery by a vertical offset distance and laterally offset from the outer periphery by a lateral offset distance. Further, the recessed sidewall of the composite sacrificial material layer 142C may comprise a cylindrical vertical surface segment that is adjoined to the tapered recessed surface segment. The cylindrical vertical surface segment may be a recessed sidewall segment of the primary sacrificial material sublayer 142P. In one embodiment, the vertical offset distance may be in a range from 10% to 90% of a vertical thickness of the taper-containing sacrificial material layer.

Each first-tier memory opening 149 comprises a tapered annular recess 149T located at the level of the composite sacrificial material layer 142C and cylindrical annular recesses 149C located at the levels of the homogeneous sacrificial material layers 142H.

Figure 5C:
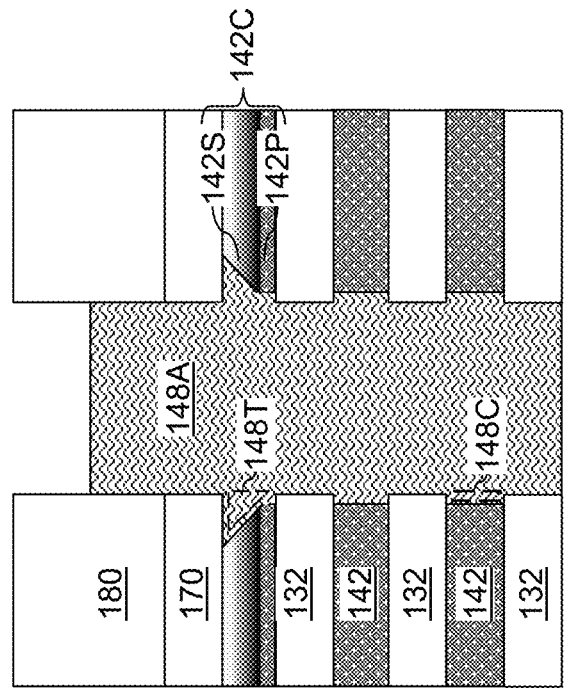

Referring to FIG. 5C, a sacrificial fill material layer 148L including a first sacrificial fill material can be deposited in the first-tier memory openings 149 and over the inter-tier dielectric layer 180. The first sacrificial fill material may comprise a semiconductor material, such as amorphous silicon or polysilicon, a carbon-based material such as amorphous carbon or diamond-like carbon, borosilicate glass, or porous or non-porous organosilicate glass.

Figure 5D:
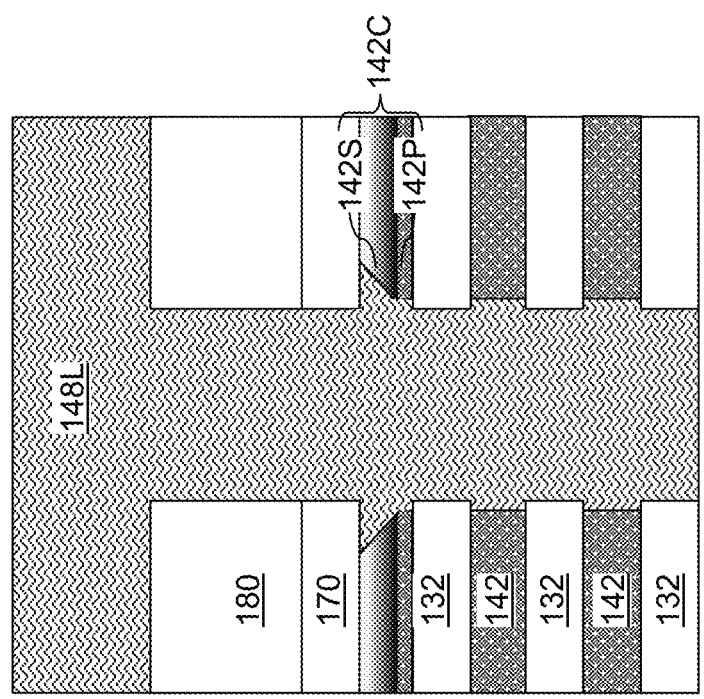

Referring to FIG. 5D, the first sacrificial fill material of the sacrificial fill material layer 148L can be vertically recessed. Each remaining portion of the first sacrificial fill material layer 148L remaining within a respective first-tier memory opening 149 comprises a first sacrificial memory opening fill portion 148A. Each first sacrificial memory opening fill portion 148A may have a top surface between a horizontal plane including the bottom surface of the inter-tier dielectric layer 180 and a horizontal plane including the top surface of the inter-tier dielectric layer 180. Each first sacrificial memory opening fill portion 148A comprises a respective tapered laterally-protruding portion 148T located in the tapered annular recess 149T at the level of the composite sacrificial material layer 142C, and a set of cylindrical laterally-protruding portions 148C located in the cylindrical annular recesses 149C at the levels of the homogeneous sacrificial material layers 142H.

Figure 5F:
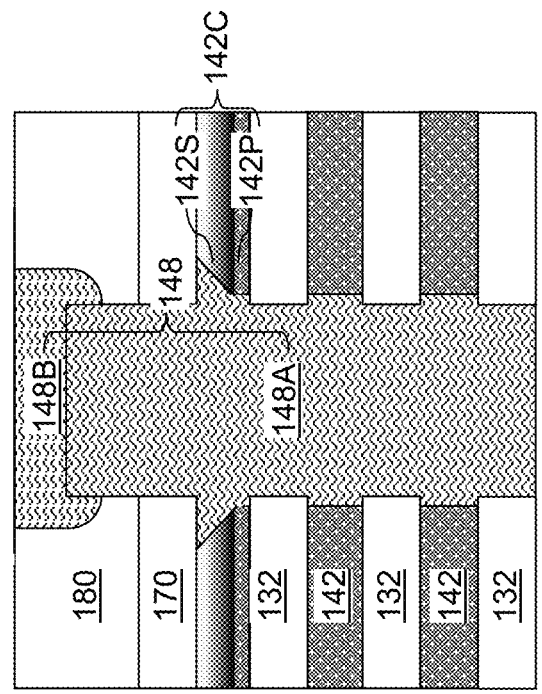
Figure 5E:
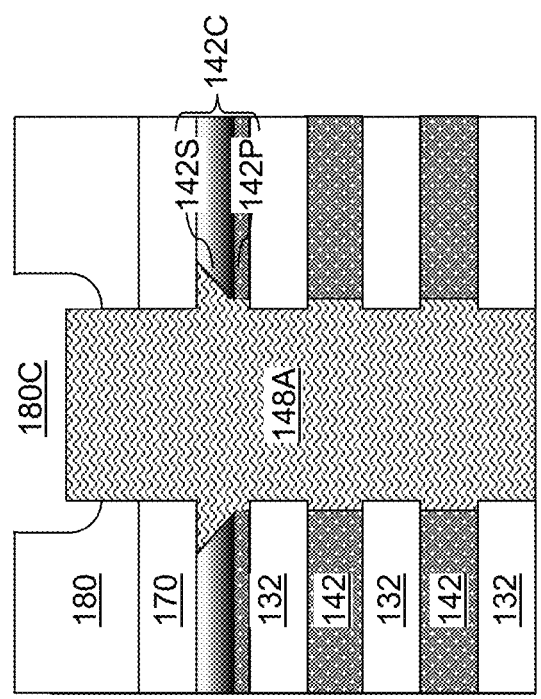

Referring to FIG. 5E, an isotropic etch process can be performed to isotropically recess the physically exposed surfaces of the inter-tier dielectric layer 180. For example, if the inter-tier dielectric layer 180 comprises silicon oxide, the isotropic etch process may comprise a wet etch process employing dilute hydrofluoric acid. Cavities 180C overlying the first sacrificial memory opening fill portions 148A are formed in the inter-tier dielectric layer 180.

Referring to FIG. 5F, a second sacrificial fill material can be deposited in the cavities 180C overlying the first sacrificial memory opening fill portions 148A. The second sacrificial fill material may comprise any material that may be employed for the first sacrificial fill material. In one embodiment, the second sacrificial fill material may be the same as the first sacrificial fill material. Excess portions of the second sacrificial fill material can be removed from above the horizontal plane including the top surface of the inter-tier dielectric layer 180. Each remaining portion of the second sacrificial fill material comprises a second sacrificial memory opening fill portion 148B. Each contiguous combination of a first sacrificial memory opening fill portion 148A and a second sacrificial memory opening fill portion 148B constitutes a sacrificial memory opening fill structure 148.

Figure 6:
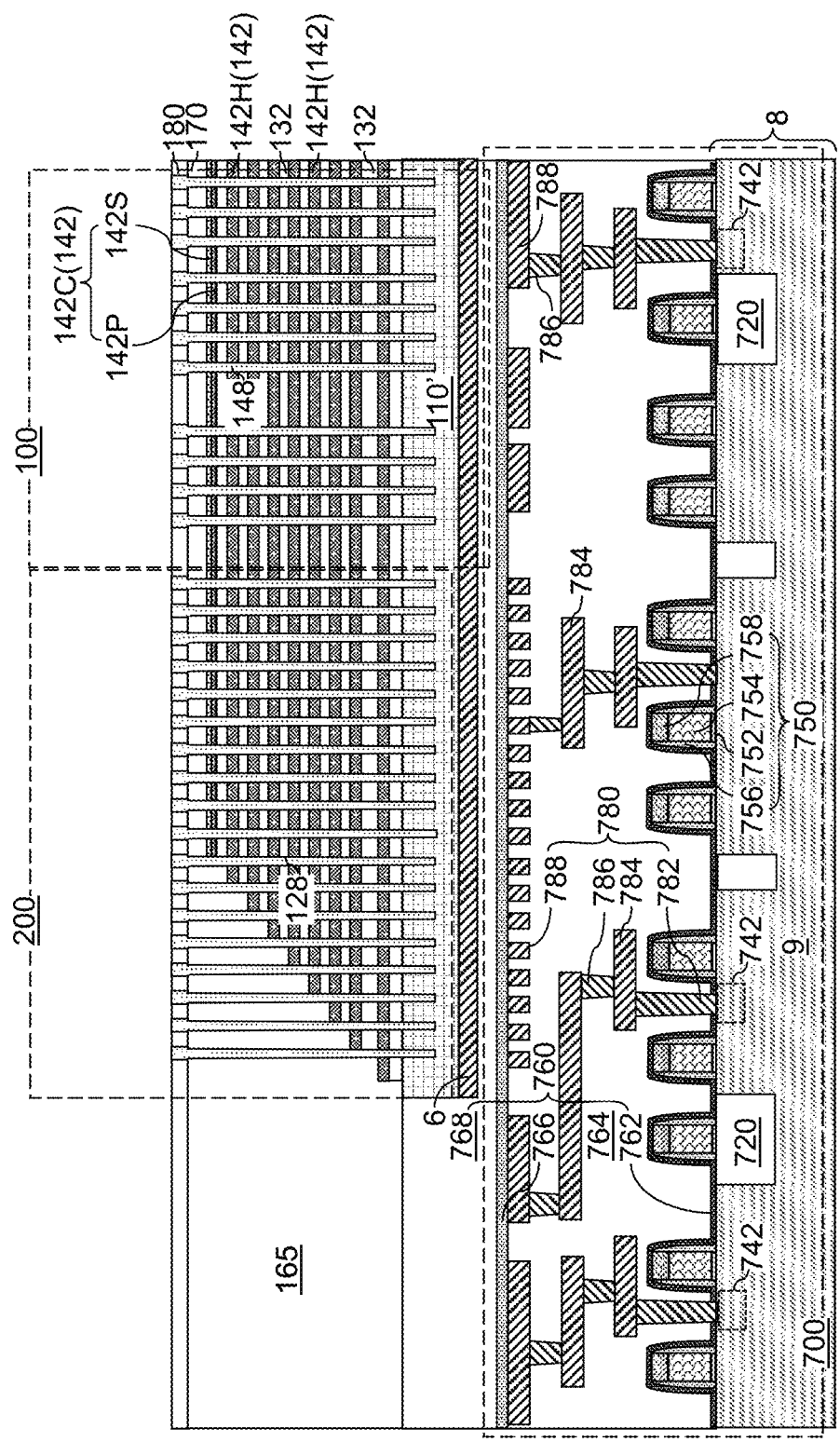
FIG. 6 is a vertical cross-sectional view of the exemplary structure after formation of various sacrificial fill structures according to an embodiment of the present disclosure.

Referring to FIG. 6, the exemplary structure is illustrated after the processing steps of FIG. 5F. Generally, sacrificial first-tier opening fill portions (148, 128) may be formed in the various first-tier openings (149, 129). At least one sacrificial fill material may be deposited in the first-tier memory openings 149 and the first-tier support openings 129, and excess portions of the at least one sacrificial fill material can be removed from above the horizontal plane including the top surface of the inter-tier dielectric layer 180. Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 7:
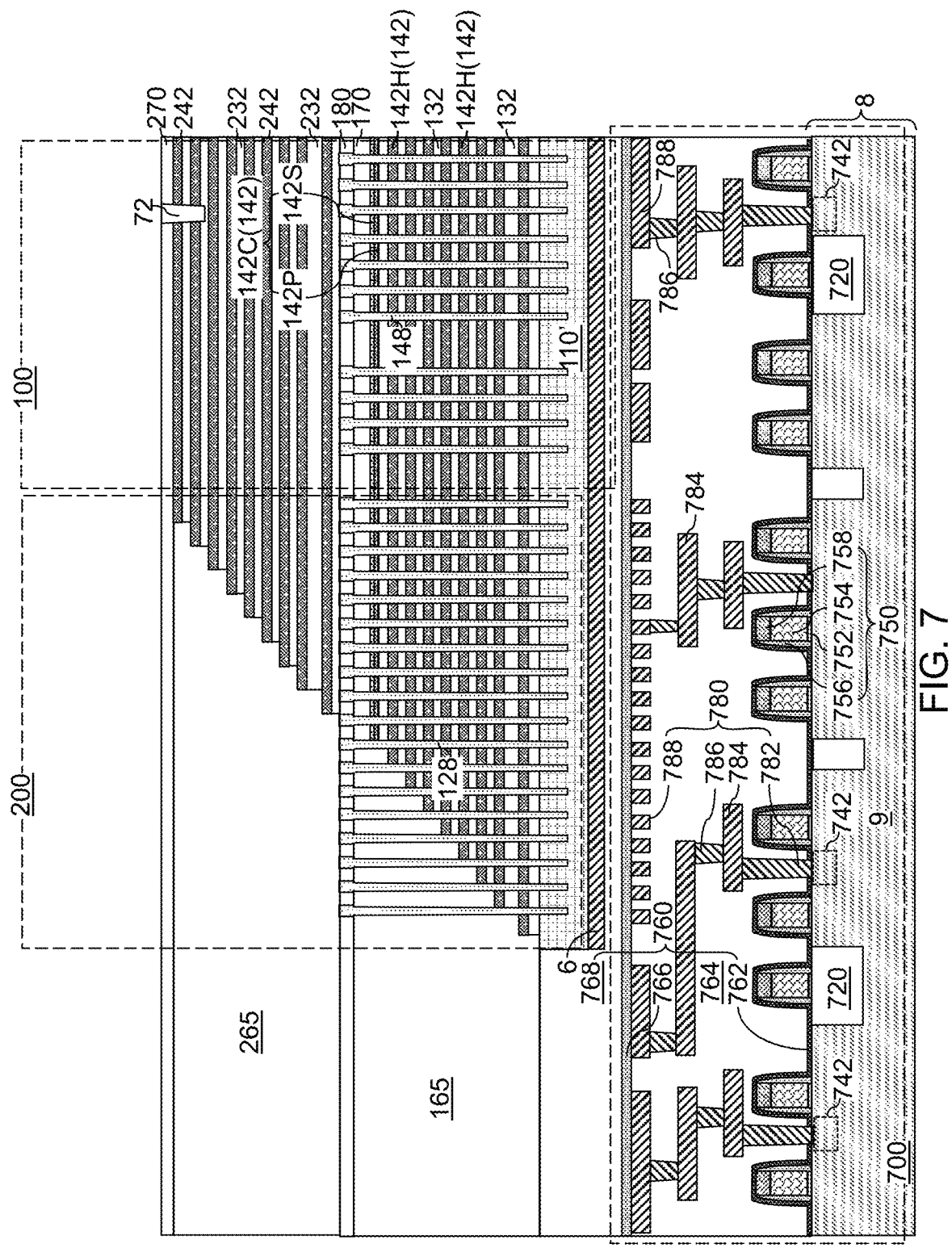
FIG. 7 is a vertical cross-sectional view of the exemplary structure after formation of a second alternating stack of second insulating layers and second spacer material layers, second stepped surfaces, and a second retro-stepped dielectric material portion according to an embodiment of the present disclosure.

Referring to FIG. 7, a second-tier structure may be formed over the first-tier structure (132, 142, 170, 148). The second-tier structure may include an additional alternating stack of insulating layers and sacrificial material layers. For example, a second alternating stack (232, 242) of second insulating layers 232 and second sacrificial material layers 242 may be formed. In one embodiment, the second insulating layers 232 may consist essentially of the same insulating material as the first insulating layers 132, and second sacrificial material layers 242 may consist essentially of the same sacrificial material as the first sacrificial material, i.e., the sacrificial material of the homogeneous sacrificial material layers 142H and the primary sacrificial material sublayer 142P.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 8A:
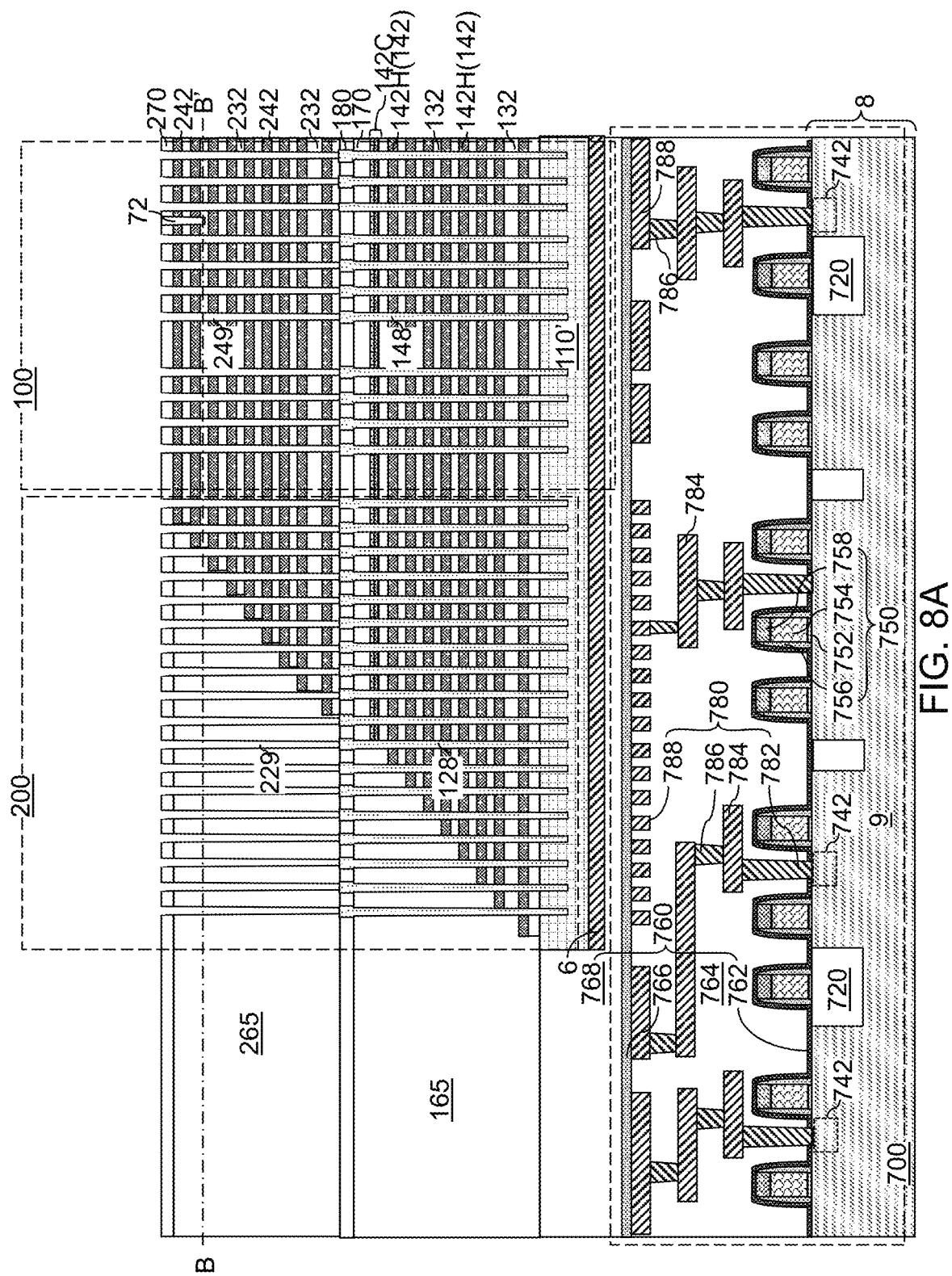
FIG. 8A is a vertical cross-sectional view of the exemplary structure after formation of second-tier memory openings and second-tier support openings according to an embodiment of the present disclosure.
Figure 8B:
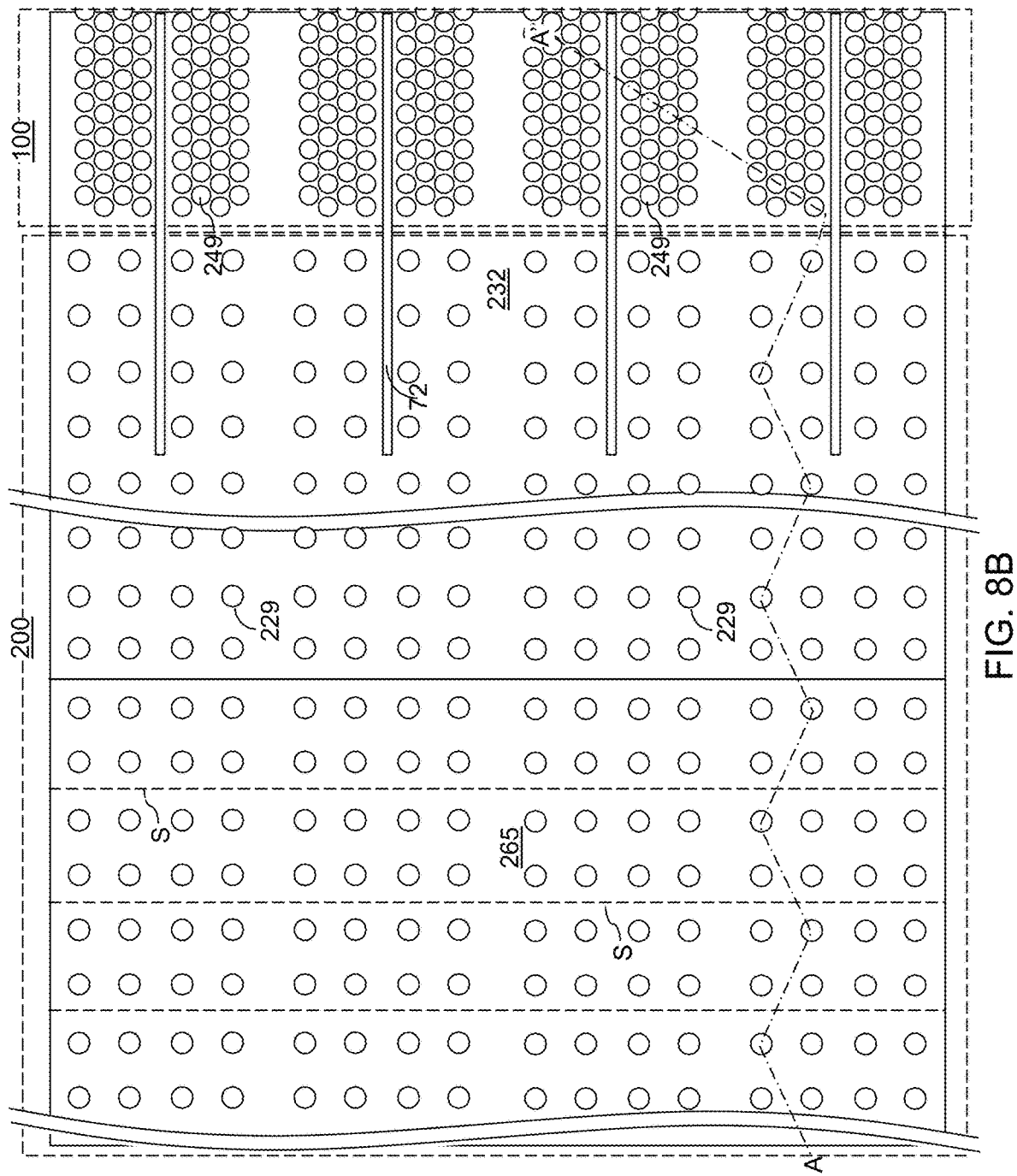
FIG. 8B is a horizontal cross-sectional view of the exemplary structure along the horizontal plane B-B' of FIG. 8A. The hinged vertical plane A-A' corresponds to the plane of the vertical cross-sectional view of FIG. 8A.
Figure 8C:
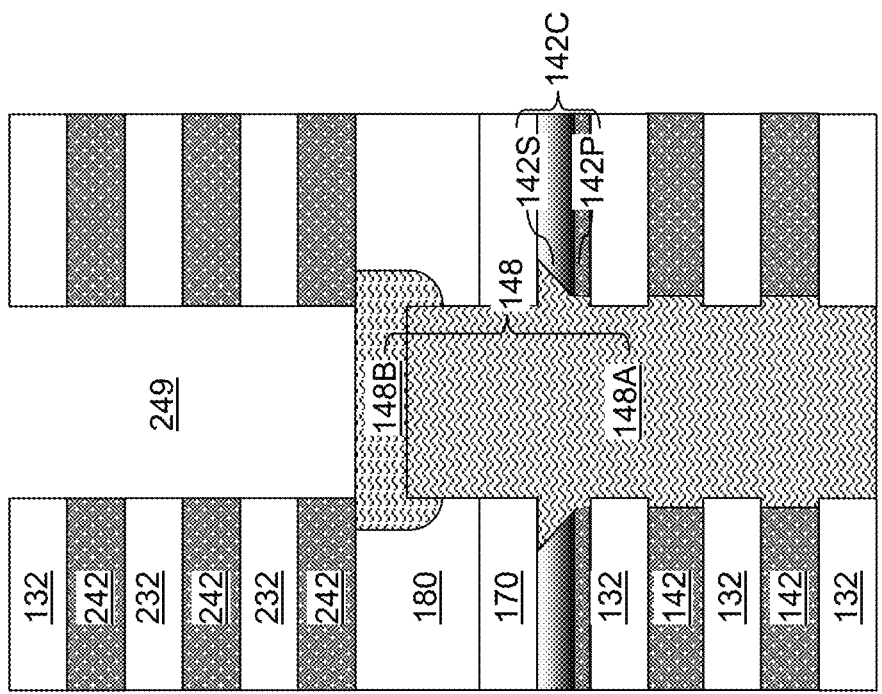
FIG. 8C is a vertical cross-sectional view of a region including an upper portion of a first-tier memory opening and a lower portion of a second-tier memory opening at the processing steps of FIGS. 8A and 8B.

Referring to FIGS. 8A-8C, various second-tier openings (249, 229) may be formed through the second-tier structure (232, 242, 265, 270, 72). A photoresist layer (not shown)

may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first alternating stack (132, 142) and the second alternating stack (232, 242) are illustrated as dotted lines in FIG. 7B.

The second anisotropic etch process may include an etch step in which the materials of the second alternating stack (232, 242) are etched concurrently with the material of the second retro-stepped dielectric material portion 265. The chemistry of the etch step may alternate to optimize etching of the materials in the second alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 9:
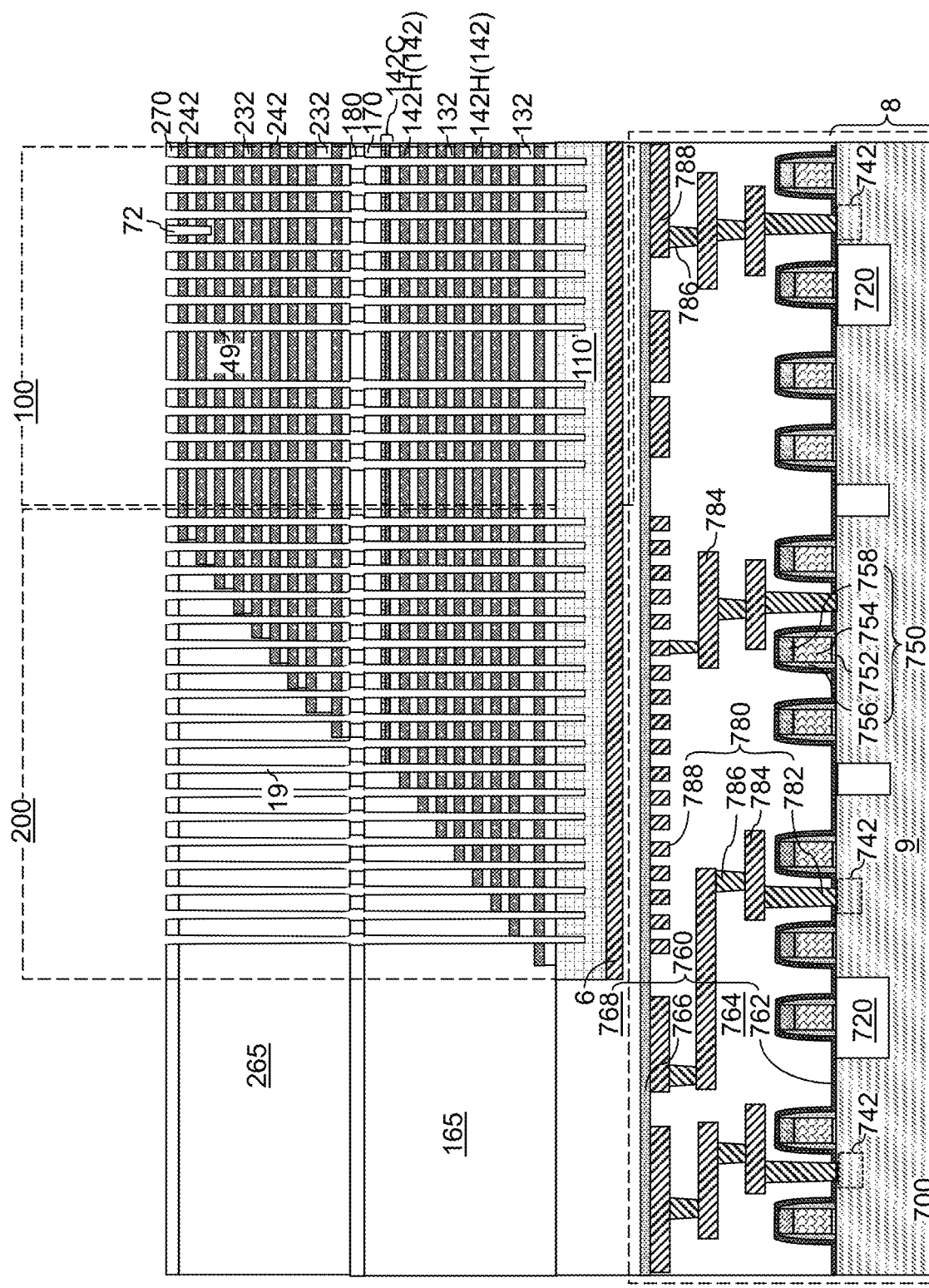
FIG. 9 is a vertical cross-sectional view of the exemplary structure after formation of inter-tier memory openings and inter-tier support openings according to an embodiment of the present disclosure.

Referring to FIG. 9, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 10A-10D provide sequential cross-sectional views of a memory opening 49 during formation of a memory opening fill structure. The same structural change occurs in each of the memory openings 49 and the support openings 19.

Referring to FIG. 10A, a memory opening 49 in the first exemplary device structure of FIG. 9 is illustrated. The memory opening 49 extends through the first-tier structure and the second-tier structure.

Referring to FIG. 10B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L). A cavity 49' may be present in the volume that is not filled with the various deposited material layers (50, 60L) in each memory opening 49.

Referring to FIG. 10C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 10D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Generally, each memory opening fill structure 58 can be formed within a volume including a first-tier memory opening 149 and a second-tier memory opening 249 (in case a second alternating stack is employed). Each memory opening fill structure 58 comprises a memory film 50 including a tunneling dielectric layer 56, a vertical stack of memory elements such as portions of the charge storage layer 54 located at the levels of the sacrificial material layers (142, 242), and a blocking dielectric layer 52. According to an aspect of the present disclosure, each memory opening fill structure 58 comprises a tapered lateral protrusion 58T having a tapered outer sidewall surface 58S located at the level of the composite sacrificial material layer 142C. A portion of an outer sidewall of the memory film 50 that vertically extends through the first alternating stack (132, 142) has a contoured vertical cross-sectional profile in which segments 50A of the outer sidewall of the memory film 50 located at levels of the first sacrificial material layers 142 laterally protrude farther outward from a vertical axis VA passing through a geometrical center GC of the memory opening fill structure 58 than segments 50B of the outer sidewall of the memory film 50 contacting sidewalls of the first insulating layers 132. In one embodiment, the entirety volume of the lateral protrusions 58P of the memory opening fill structure 58 at the levels of the first sacrificial material layers 142 may be filled with the memory film 50. The outer sidewall of the tapered lateral protrusion 58T may extend further away from the vertical axis VA than the outer sidewalls of the lateral protrusions 58P.

In one embodiment, a second alternating stack of second insulating layers 232 and second sacrificial material layers 242 may overlie the first alternating stack (132, 142). Each memory opening fill structure 58 may vertically extend through the second alternating stack (232, 242). In one embodiment, a portion of the outer sidewall of the memory film 50 in each memory opening fill structure 58 can vertically extend through the second alternating stack (232, 242), and can have a straight vertical cross-sectional profile that extends from a bottommost layer within the second alternating stack (232, 242) to a topmost layer within the alternating stack (232, 242). Thus, the memory opening fill structure 58 may lack the lateral protrusions 58P at the levels of the second alternating stack (232, 242).

Figure 11A:
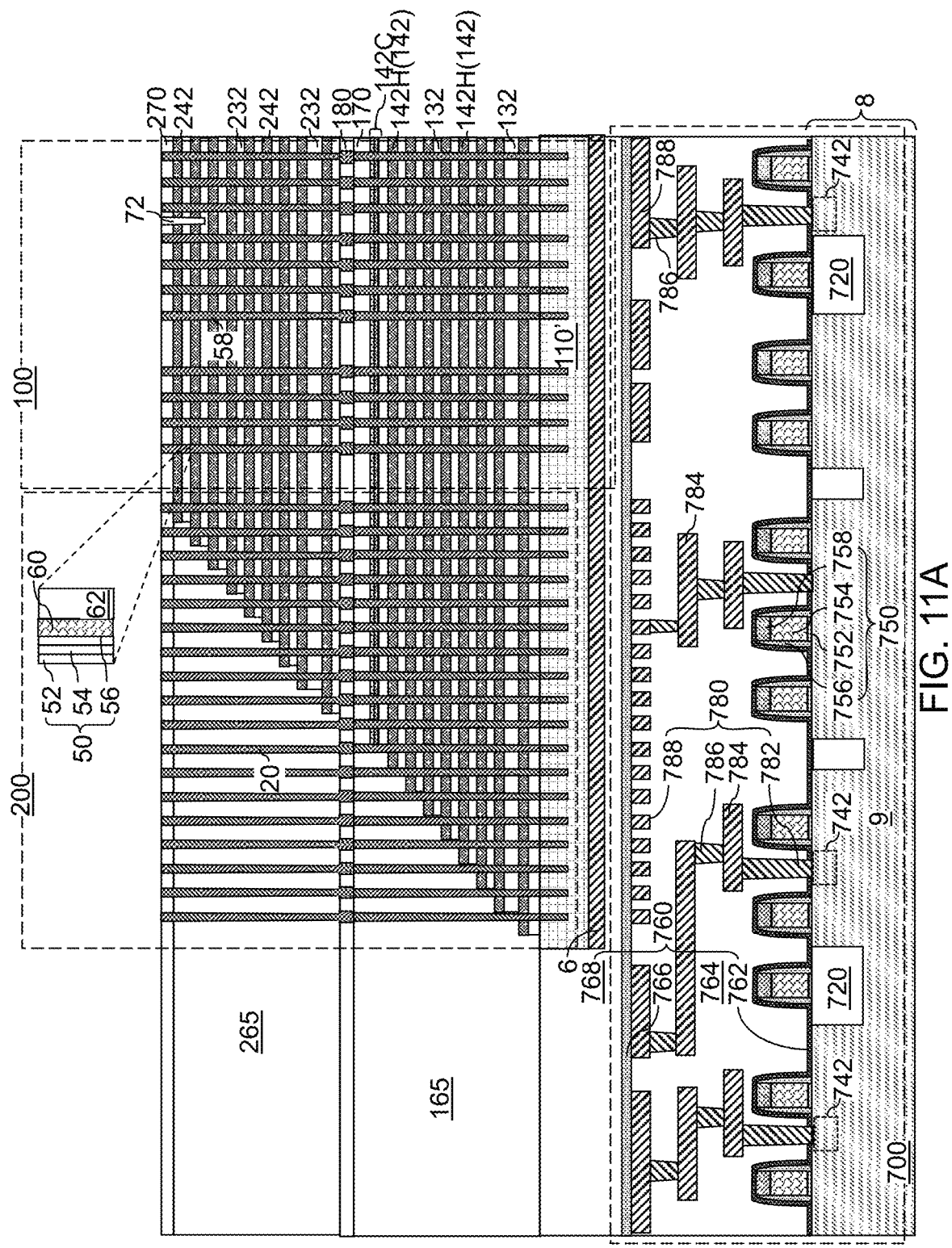
FIG. 11A is a vertical cross-sectional view of the exemplary structure after formation of memory opening fill structures and support pillar structures according to an embodiment of the present disclosure.
Figure 11B:
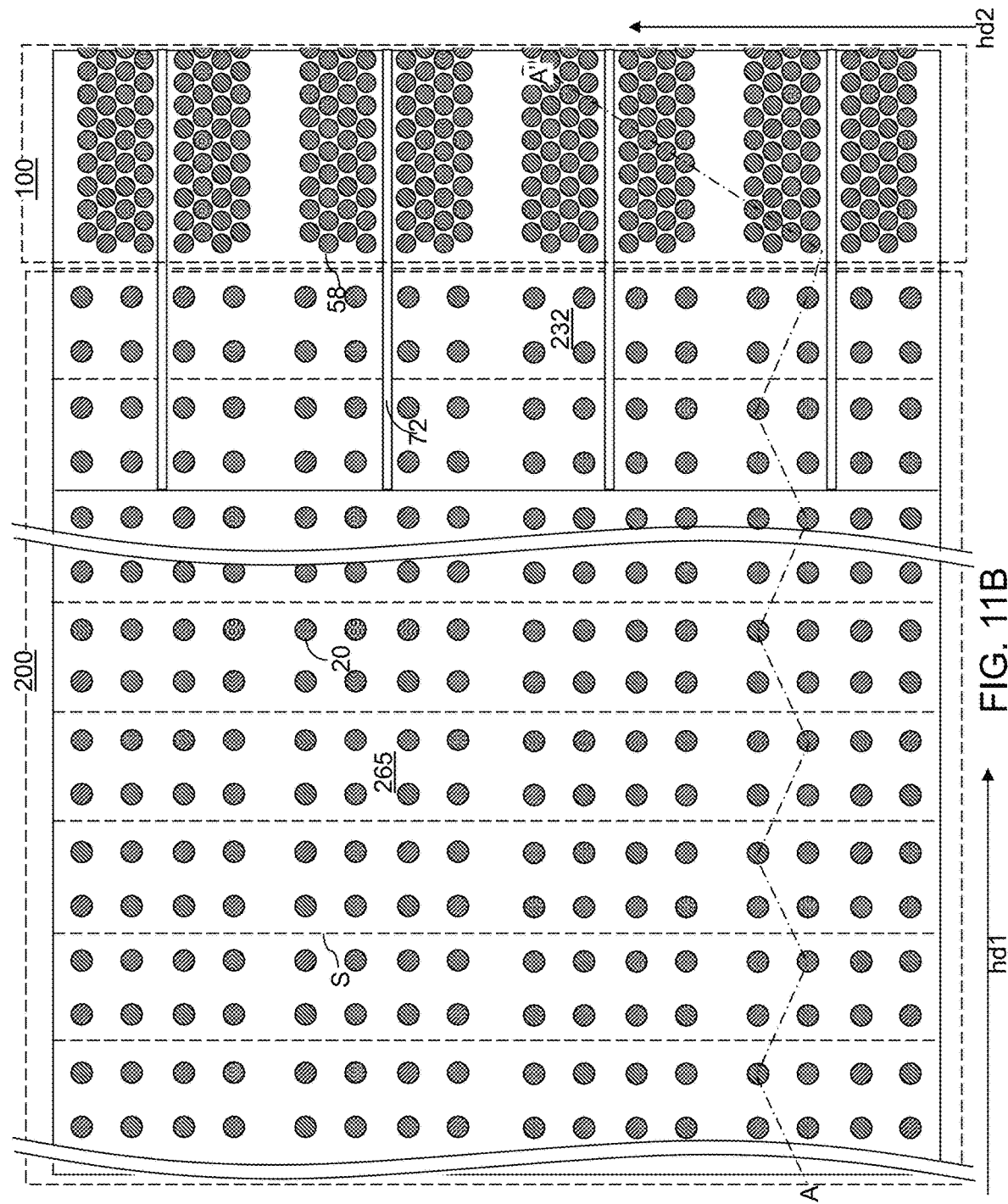
FIG. 11B is a top-down view of the exemplary structure of FIG. 11A. The hinged vertical plane A-A' corresponds to the plane of the vertical cross-sectional view of FIG. 11A.

Referring to FIGS. 11A and 11B, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 12A:
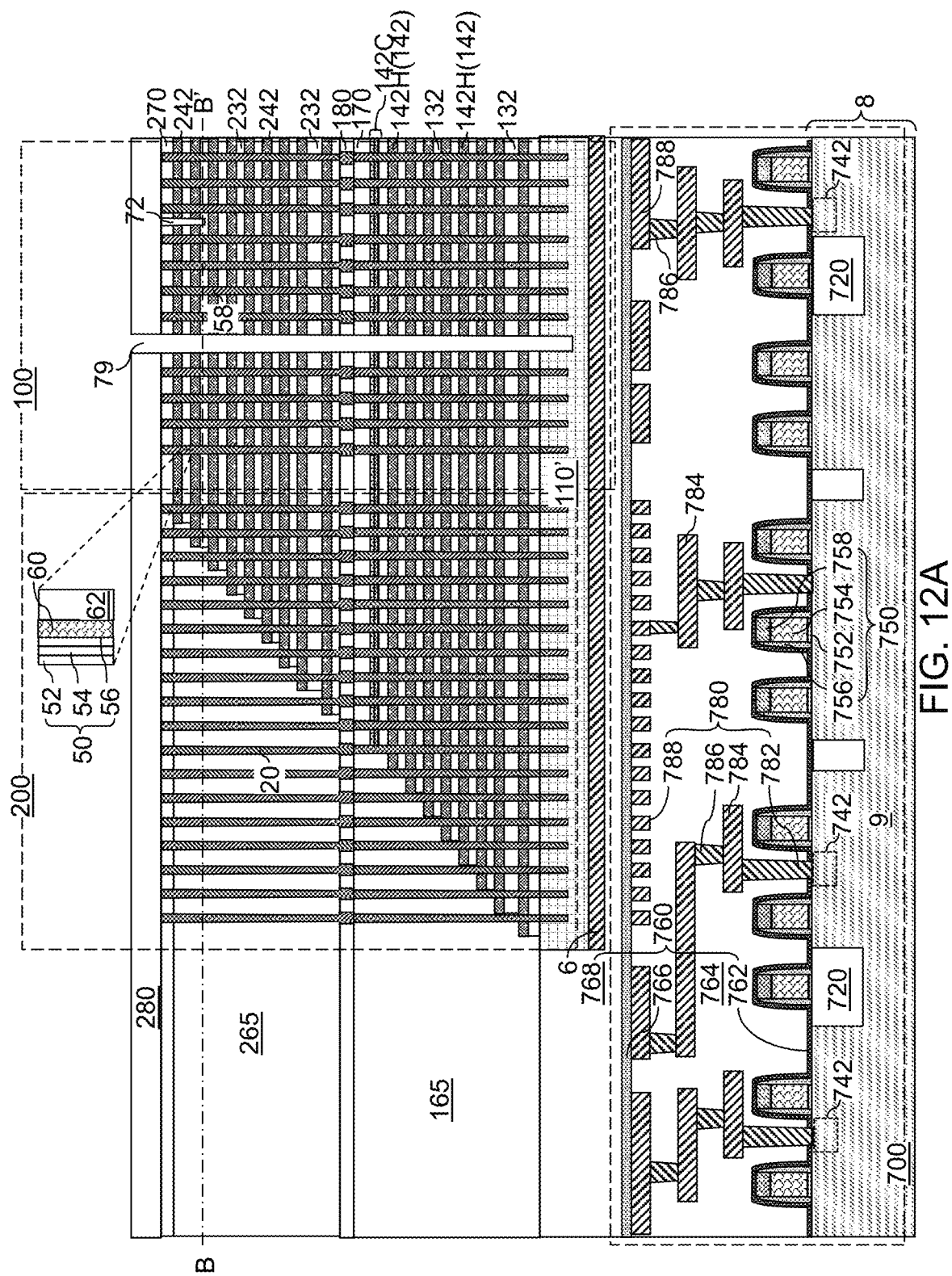
FIG. 12A is a vertical cross-sectional view of the exemplary structure after formation of a first contact-level dielectric layer and backside trenches according to an embodiment of the present disclosure.

Referring to FIGS. 12A and 12B, a first contact-level dielectric layer 280 may be formed over the second-tier structure (232, 242, 270, 265, 72). The first contact-level dielectric layer 280 includes a dielectric material such as silicon oxide, and may be formed by a conformal or nonconformal deposition process. For example, the first contact-level dielectric layer 280 may include undoped silicate glass and may have a thickness in a range from 100 nm to 600 nm, although lesser and greater thicknesses may also be used.

Figure 13:
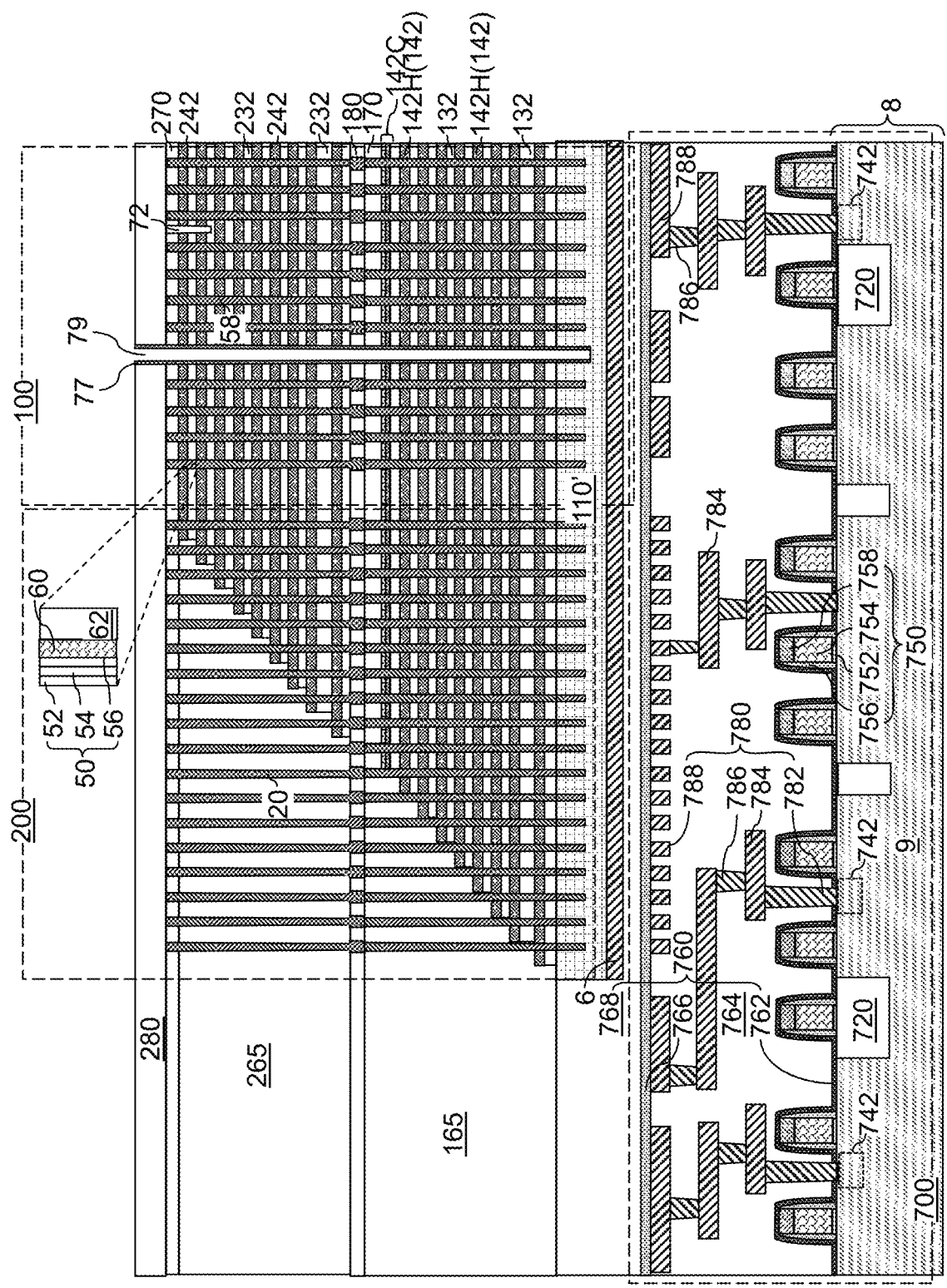
FIG. 13 is a vertical cross-sectional view of the exemplary structure after formation of backside trench spacers according to an embodiment of the present disclosure.
Figure 14A:
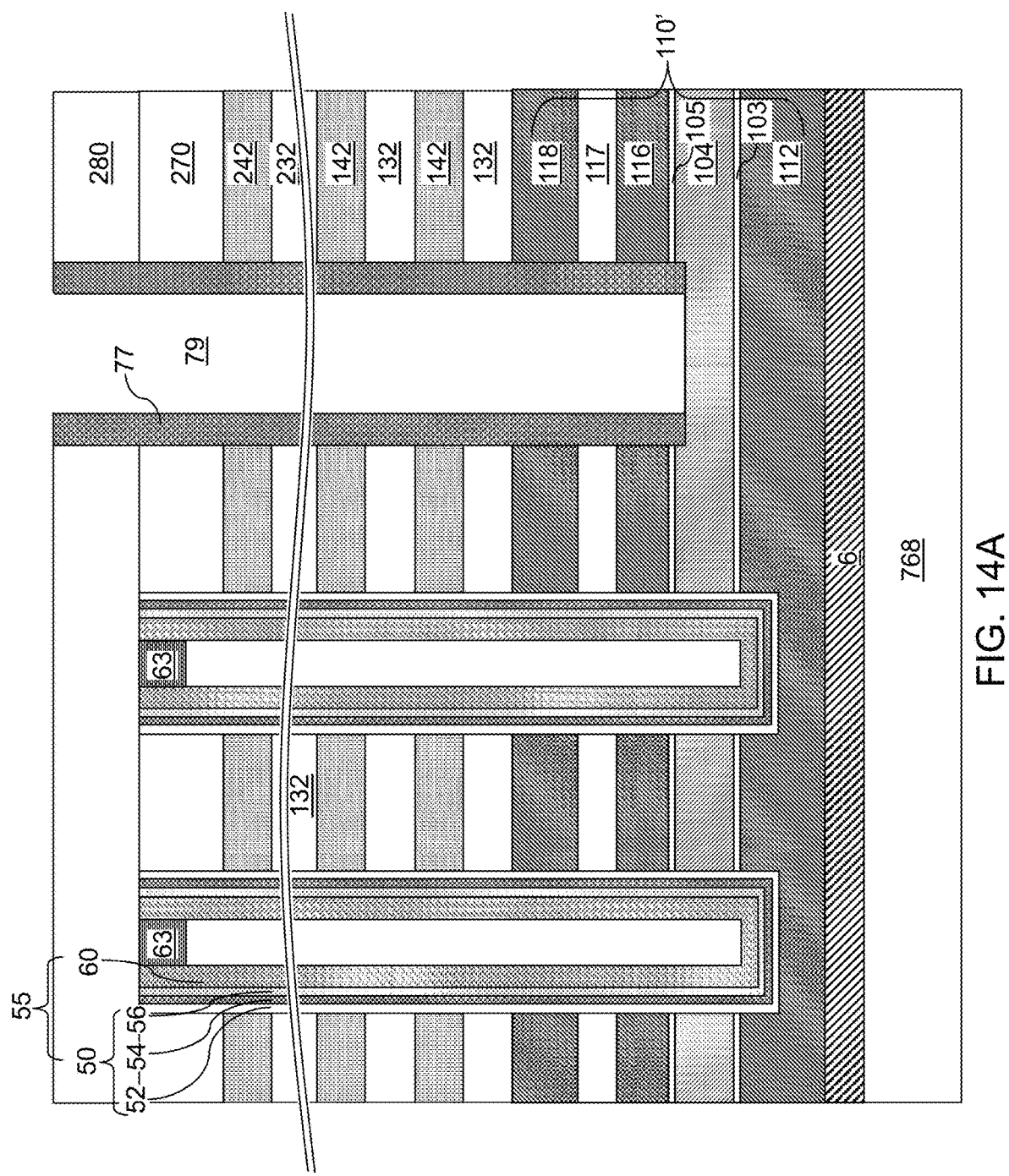
FIGS. 14A-14E illustrate sequential vertical cross-sectional views of memory opening fill structures and a backside trench during formation of source-level material layers according to an embodiment of the present disclosure.

Referring to FIGS. 13 and 14A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 14B:
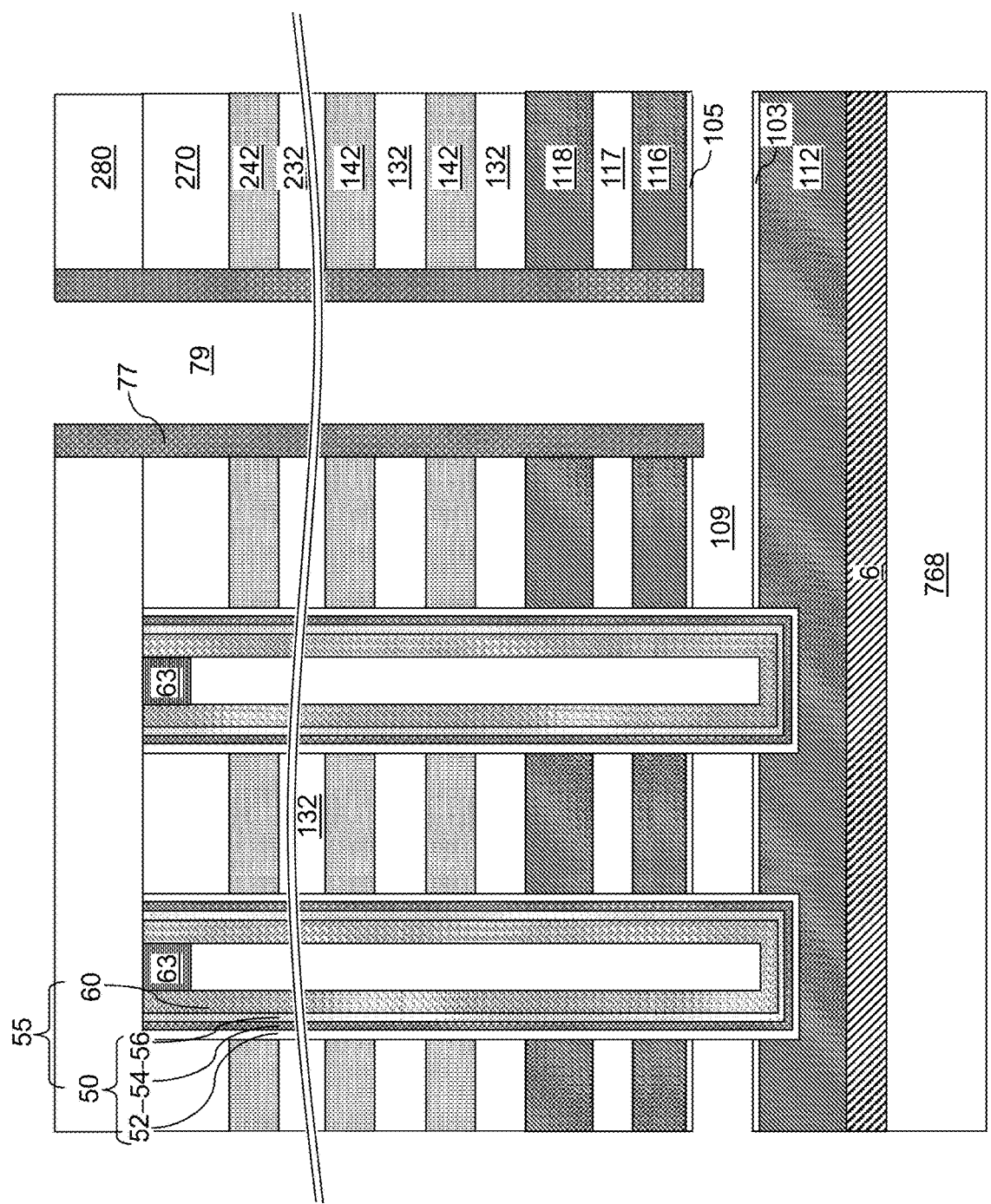

Referring to FIG. 14B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 14C:
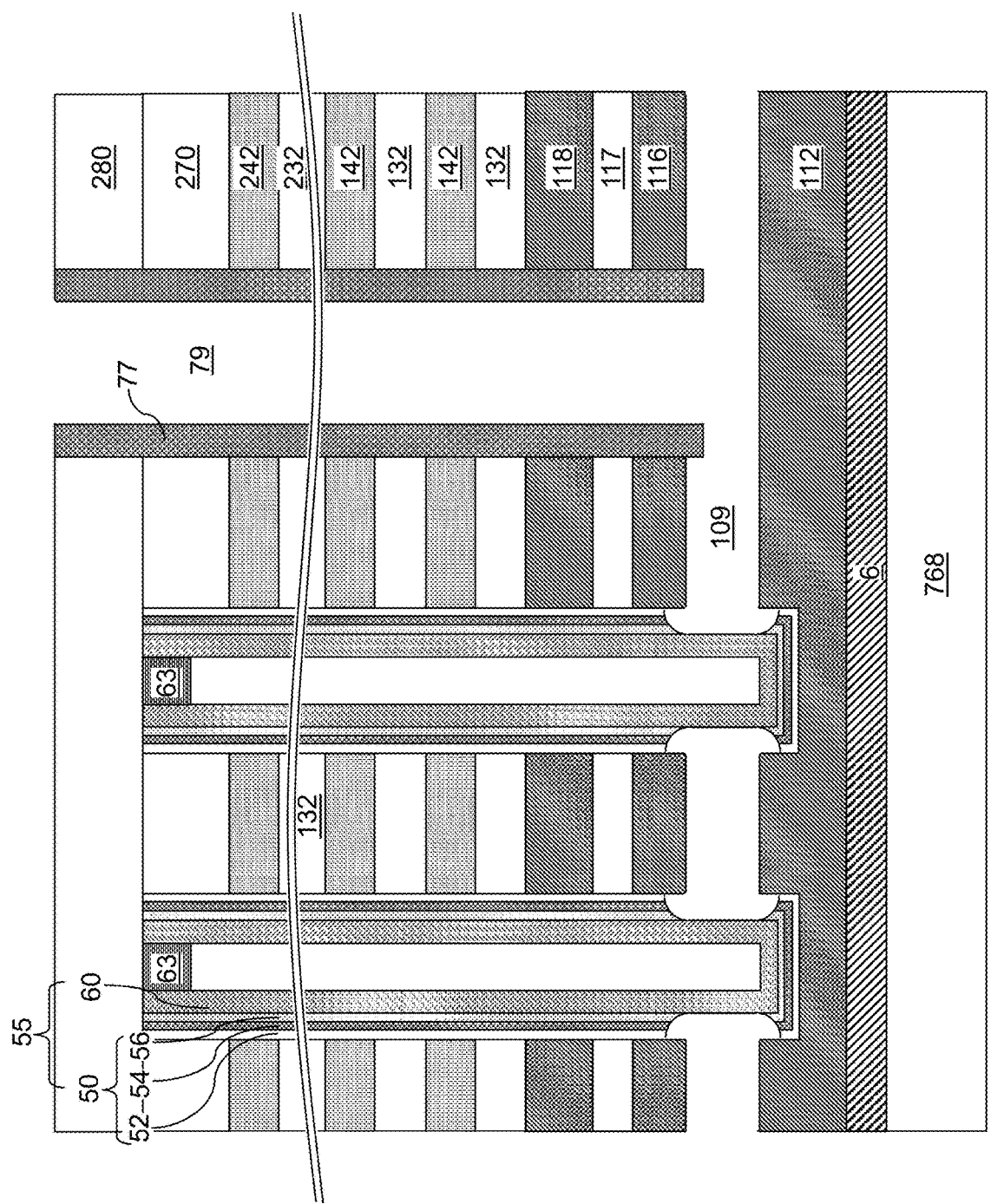

Referring to FIG. 14C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 14D:
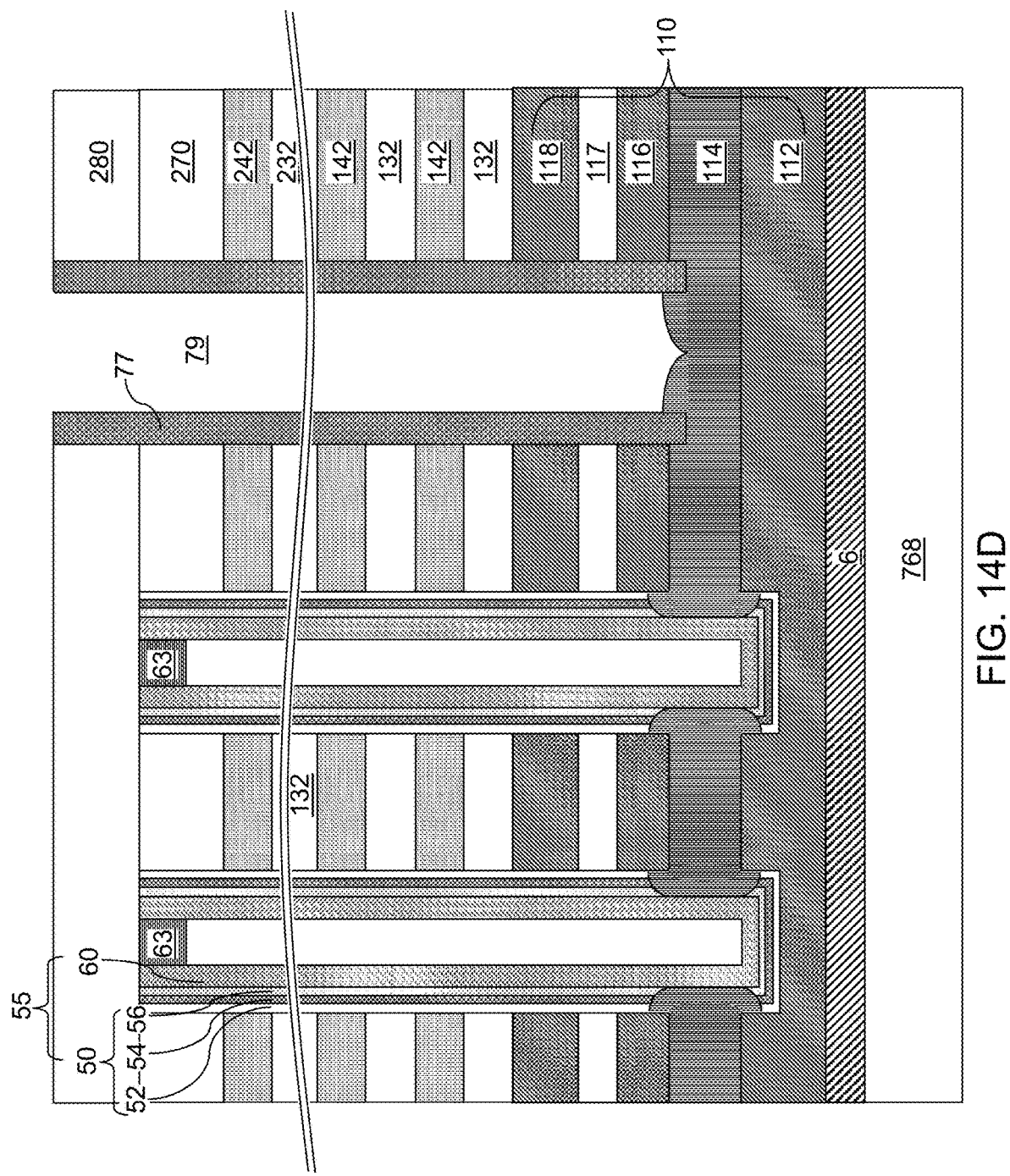

Referring to FIG. 14D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 14E:
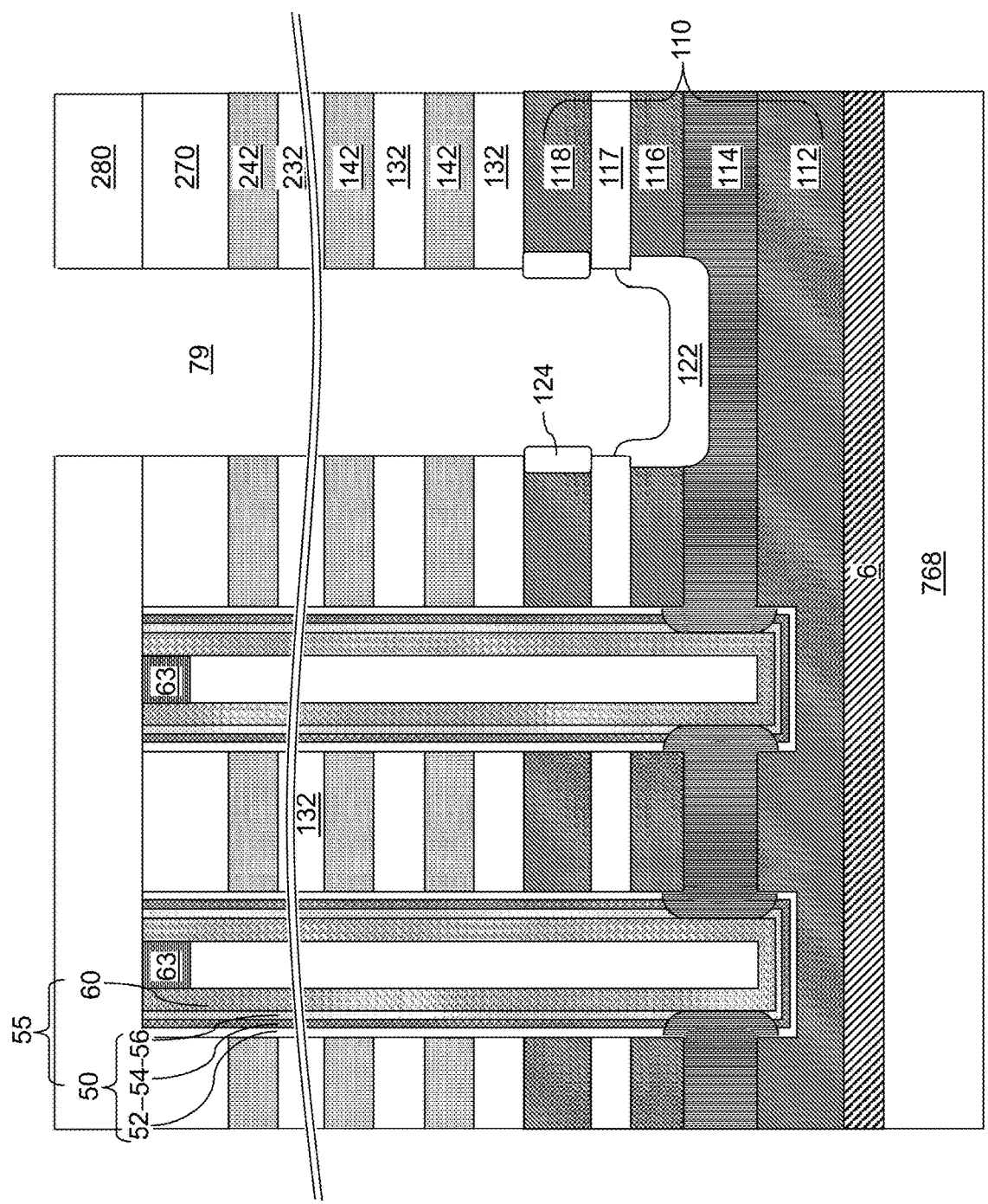
Figure 15:
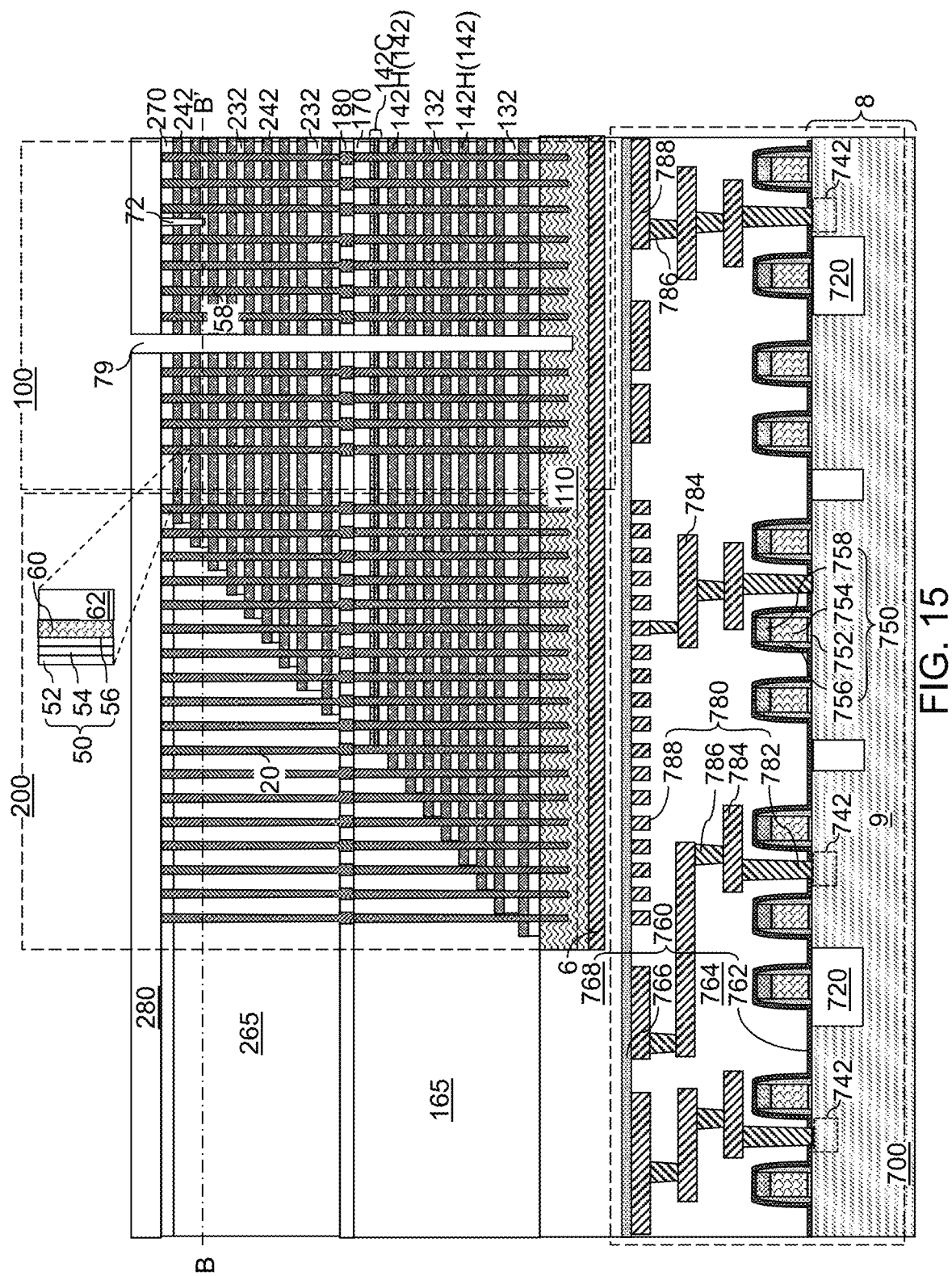
FIG. 15 is a vertical cross-sectional view of the exemplary structure after formation of source-level material layers according to an embodiment of the present disclosure.

Referring to FIGS. 14E and 15, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 16A:
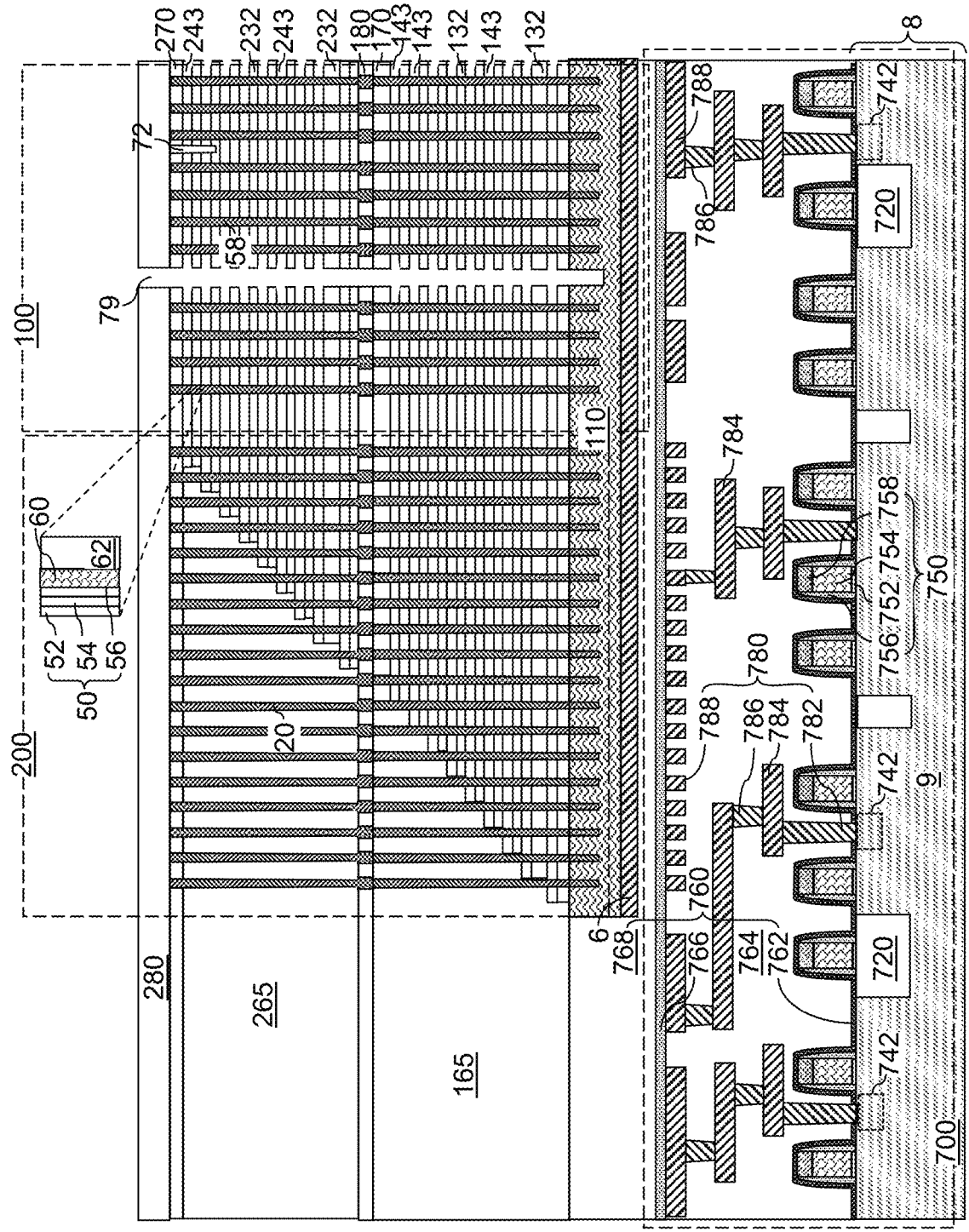
FIG. 16A is a vertical cross-sectional view of the exemplary structure after formation of backside recesses according to an embodiment of the present disclosure.
Figure 16B:
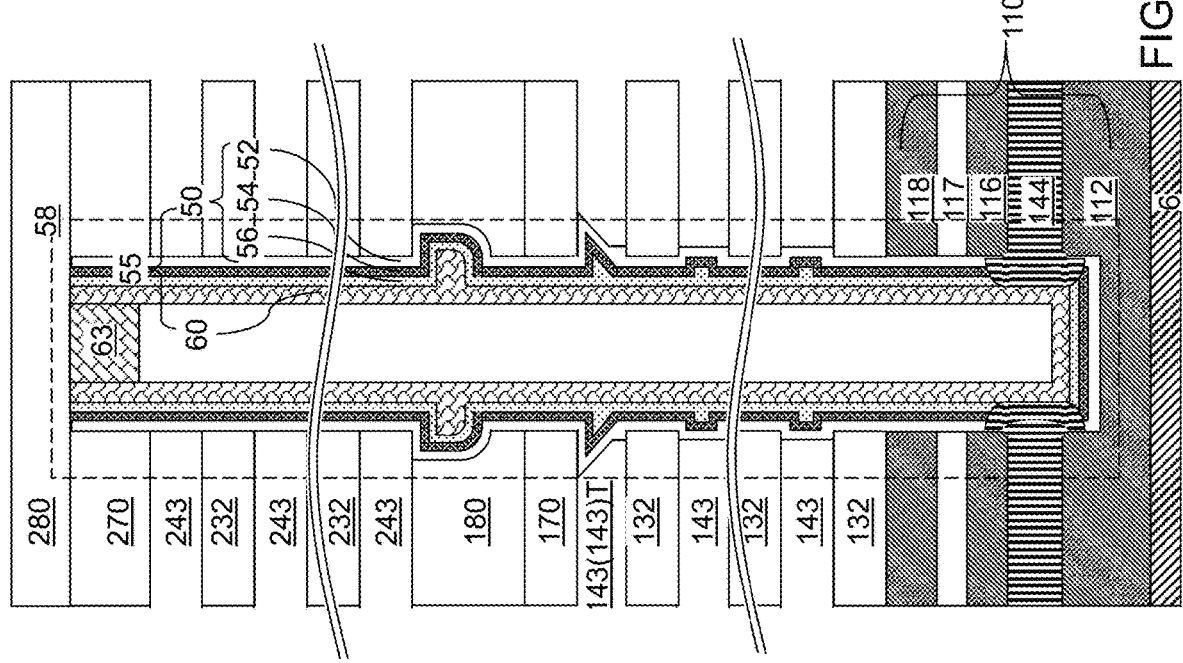
FIG. 16B is a vertical cross-sectional view of a region including a memory opening fill structure in the exemplary structure of FIG. 16A.

Referring to FIGS. 16A and 16B, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. In one embodiment, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 17A:
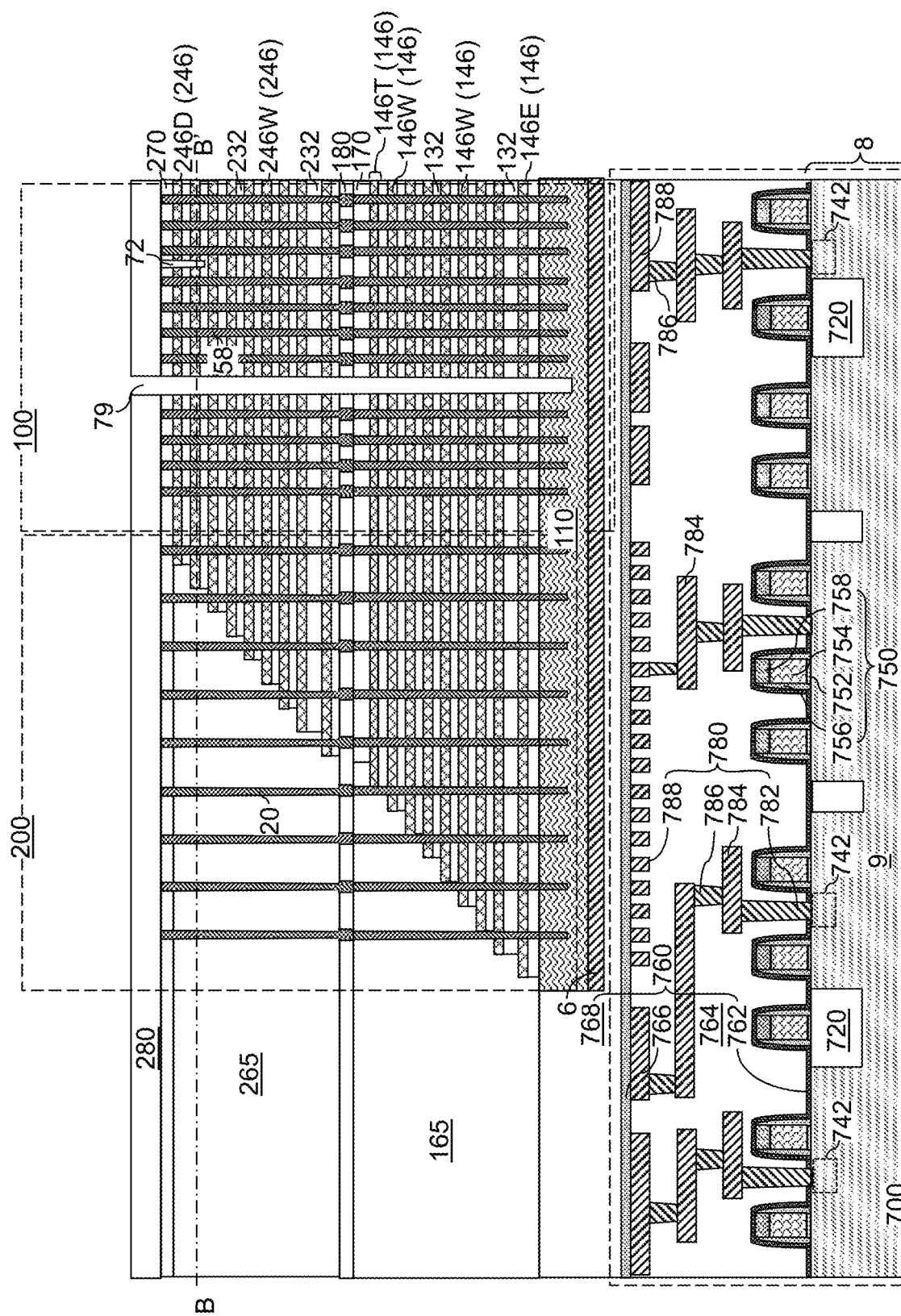
FIG. 17A is a vertical cross-sectional view of the exemplary structure after formation of electrically conductive layers according to an embodiment of the present disclosure.
Figure 17B:
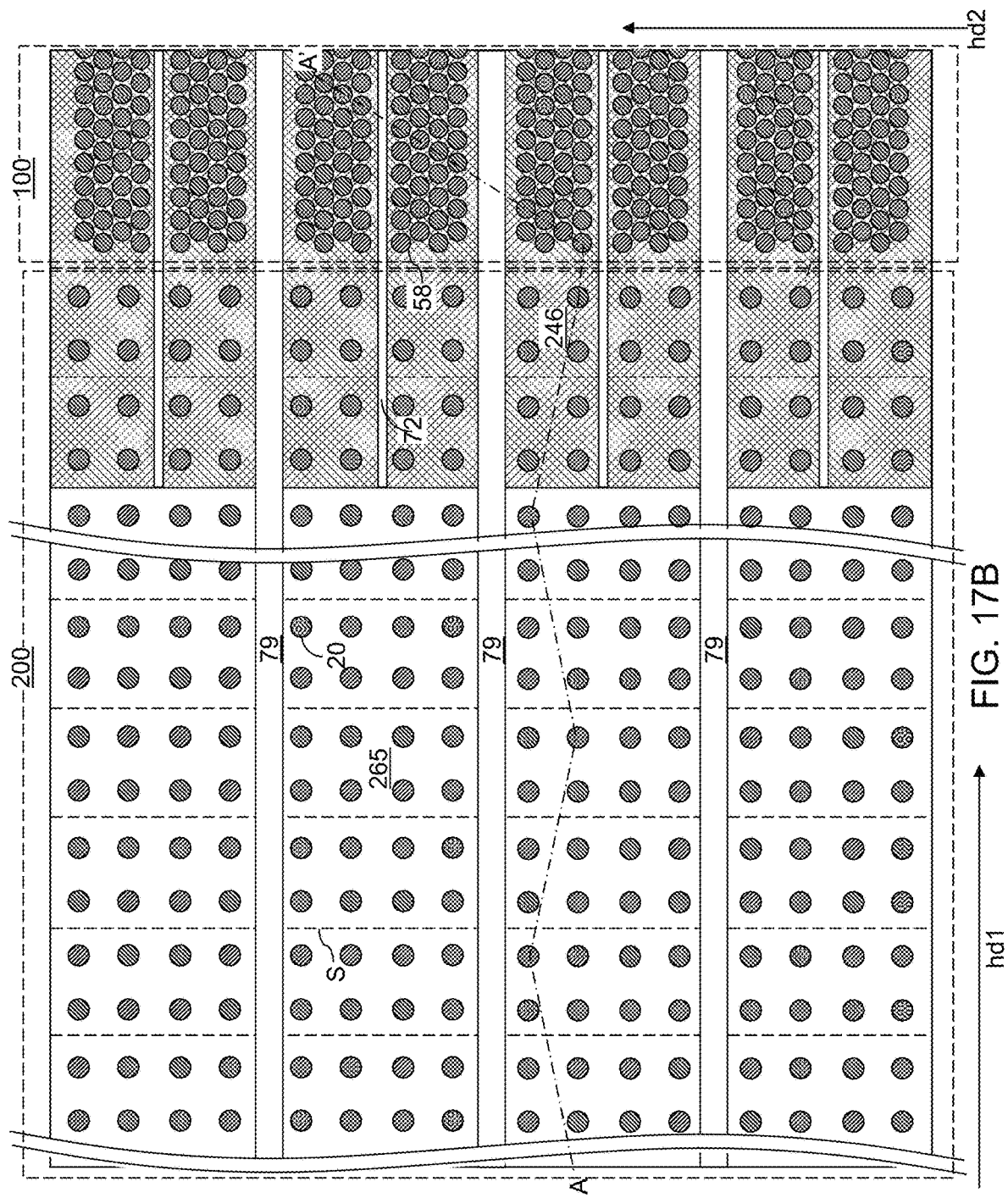
FIG. 17B is a horizontal cross-sectional view of the exemplary structure along the horizontal plane B-B' of FIG. 17A. The hinged vertical plane A-A' corresponds to the plane of the vertical cross-sectional view of FIG. 17A.
Figure 17C:
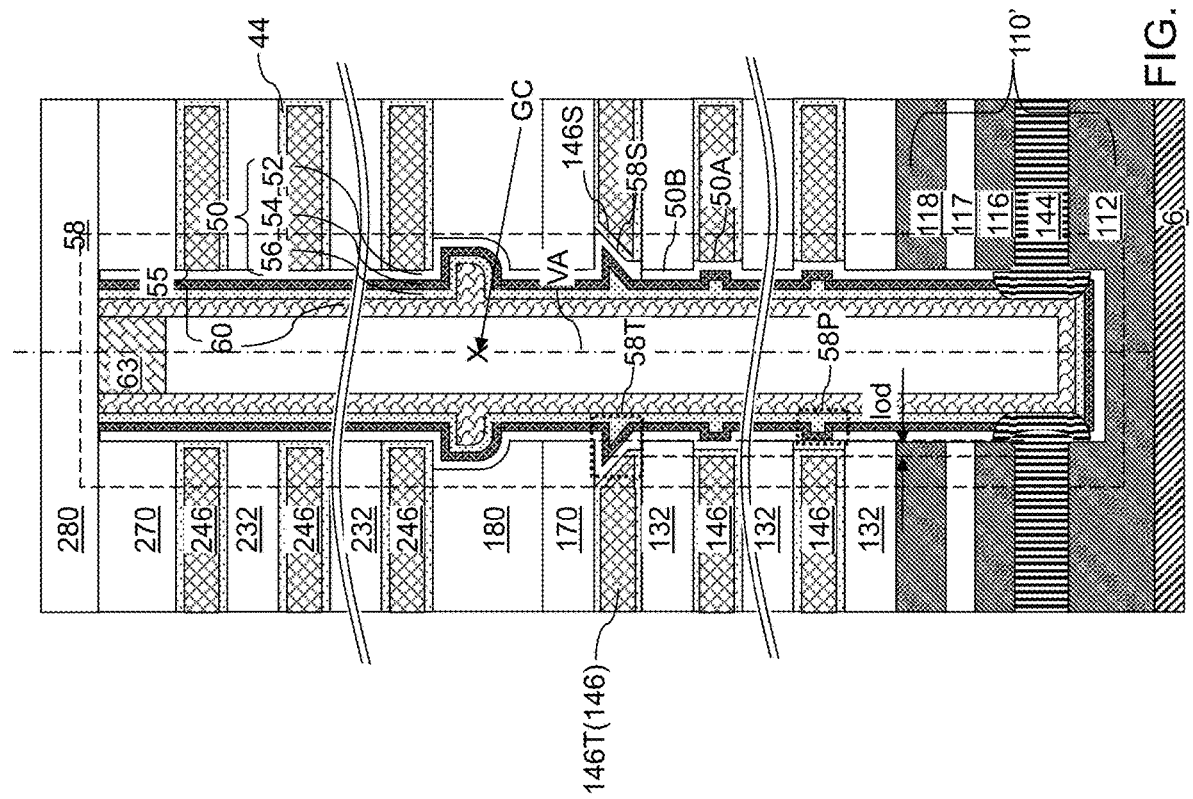
FIG. 17C is a vertical cross-sectional view of a region including a memory opening fill structure in the exemplary structure of FIGS. 17A and 17B.

Referring to FIGS. 17A-17C, a backside blocking dielectric layer 44 may be optionally deposited in the backside recesses (143, 243) and the backside trenches 79 and over the first contact-level dielectric layer 280. The backside blocking dielectric layer 44 includes a dielectric material such as a dielectric metal oxide, silicon oxide, or a combination thereof. For example, the backside blocking dielectric layer 44 may include aluminum oxide. The backside blocking dielectric layer 44 may be formed by a conformal deposition process such as atomic layer deposition or chemical vapor deposition. The thickness of the backside blocking dielectric layer 44 may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer 44 and a first electrically conductive layer 146, and each second sacrificial material layer 242 may be replaced with an optional portion of the backside blocking dielectric layer 44 and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

In some embodiments, drain-select-level isolation structures 72 may be provided at topmost levels of the second electrically conductive layers 246. A subset 246D of the second electrically conductive layers 246 located at the levels of the drain-select-level isolation structures 72 constitutes drain select gate electrodes. A subset (146W, 246W) of the electrically conductive layers (146, 246) located underneath the drain select gate electrodes constitutes word lines which may function as combinations of a control gate and a word line located at the same level. The control gate electrodes (146W, 246W) within each electrically conductive layer (146, 246) are the control gate electrodes for a vertical memory device including the memory stack structure 55. A subset 146E of the first electrically conductive layers 146 located below the word lines (146W, 246W) constitutes source select gate electrodes.

Generally, the first sacrificial material layers 142 can be replaced with the first electrically conductive layers 146. One of the first electrically conductive layers 146 comprises a taper-containing electrically conductive layer 146T that is formed in a volume from which the composite sacrificial material layer 142C is removed. The taper-containing electrically conductive layer 146T is located at the level of the tapered lateral protrusion 58T of a respective memory opening fill structure 58 located in a respective memory opening 49. The taper-containing electrically conductive layer 146T may function as a dummy word line. In other words, the dummy word line is not used to program or read a memory cell, but is activated to maintain current flow through the vertical semiconductor channel 60 at the joint region between the first and second alternating stacks.

In one embodiment shown in FIG. 17C, the taper-containing electrically conductive layer 146T comprises a contoured sidewall having a tapered sidewall segment 146S that is parallel to the tapered sidewall surface 58S of the tapered lateral protrusion 58T of a respective memory opening fill structure 58. In one embodiment, the tapered sidewall segment 146S is an annular tapered sidewall segment having an inner periphery that is vertically offset from an outer periphery by a vertical offset distance. In one embodiment, the vertical offset distance may be in a range from 10% to 100% of a vertical thickness of the taper-containing electrically conductive layer 146T.

In one embodiment, the inner periphery of the annular tapered sidewall segment is adjoined to a first closed periphery of a first horizontal surface of the taper-containing electrically conductive layer 146T, and the outer periphery of the annular tapered sidewall segment is adjoined to a second closed periphery of a second horizontal surface of the taper-containing electrically conductive layer 146T. In one embodiment, the inner periphery of the tapered sidewall segment may be laterally offset outward from a cylindrical sidewall of a first insulating layer 132 that is most proximal to the taper-containing electrically conductive layer 146T of the first insulating layers 132 by a uniform lateral offset distance "lod". In one embodiment, each of the first electrically conductive layers 146 except the taper-containing electrically conductive layer 146T comprises a respective cylindrical sidewall that is laterally offset from a respective most proximal underlying first insulating layer 132 of the first insulating layers 132 by the uniform lateral offset distance "lod".

In one embodiment shown in FIG. 17C, an entirety volume of the tapered lateral protrusion 58T of each memory opening fill structure 58 may be filled with a respective memory film 50. In one embodiment, a portion of an outer sidewall of the memory film 50 in each memory opening fill structure 58 may vertically extend through the first alternating stack (132, 146), and may have a contoured vertical cross-sectional profile in which segments 50A of the outer sidewall of the memory film 50 located at levels of the first electrically conductive layers 146 laterally protrude farther outward from a vertical axis VA passing through a geometrical center GC of the memory opening fill structure 58 than segments 50B of the outer sidewall of the memory film 50 contacting sidewalls of the first insulating layers 132.

A second alternating stack of second insulating layers 232 and second electrically conductive layers 246 can overlie the first alternating stack (132, 146). The memory opening fill structure 58 vertically extends through the second alternating stack (232, 246). A portion of the outer sidewall of the memory film 50 of each memory opening fill structure 58 can vertically extend through the second alternating stack (232, 246), and can have a straight vertical cross-sectional profile that extends from a bottommost layer within the second alternating stack (232, 246) to a topmost layer within the alternating stack (232, 246).

Figure 18A:
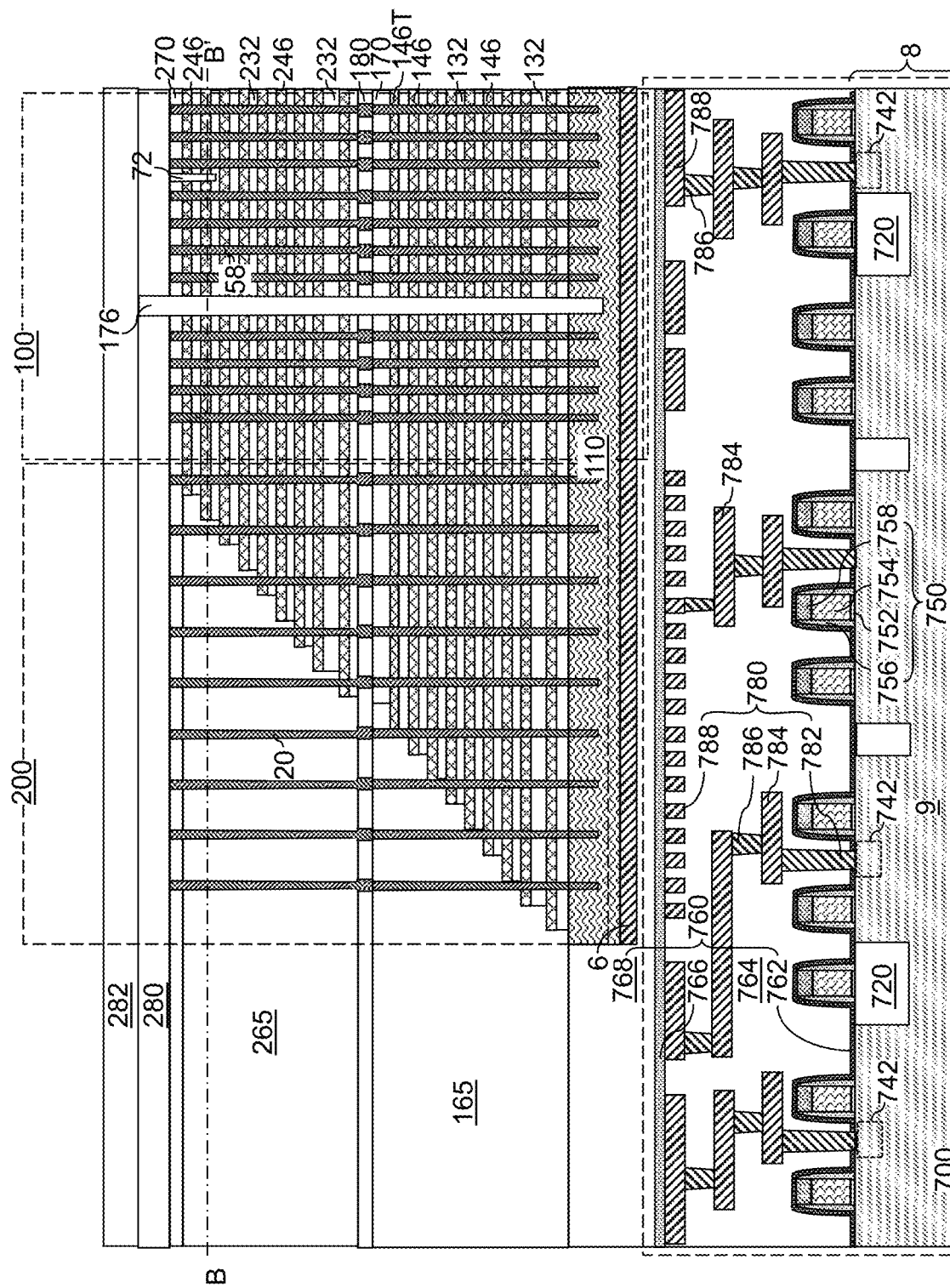
FIG. 18A is a vertical cross-sectional view of the exemplary structure after formation of backside trench fill structures in the backside trenches according to an embodiment of the present disclosure.
Figure 18B:
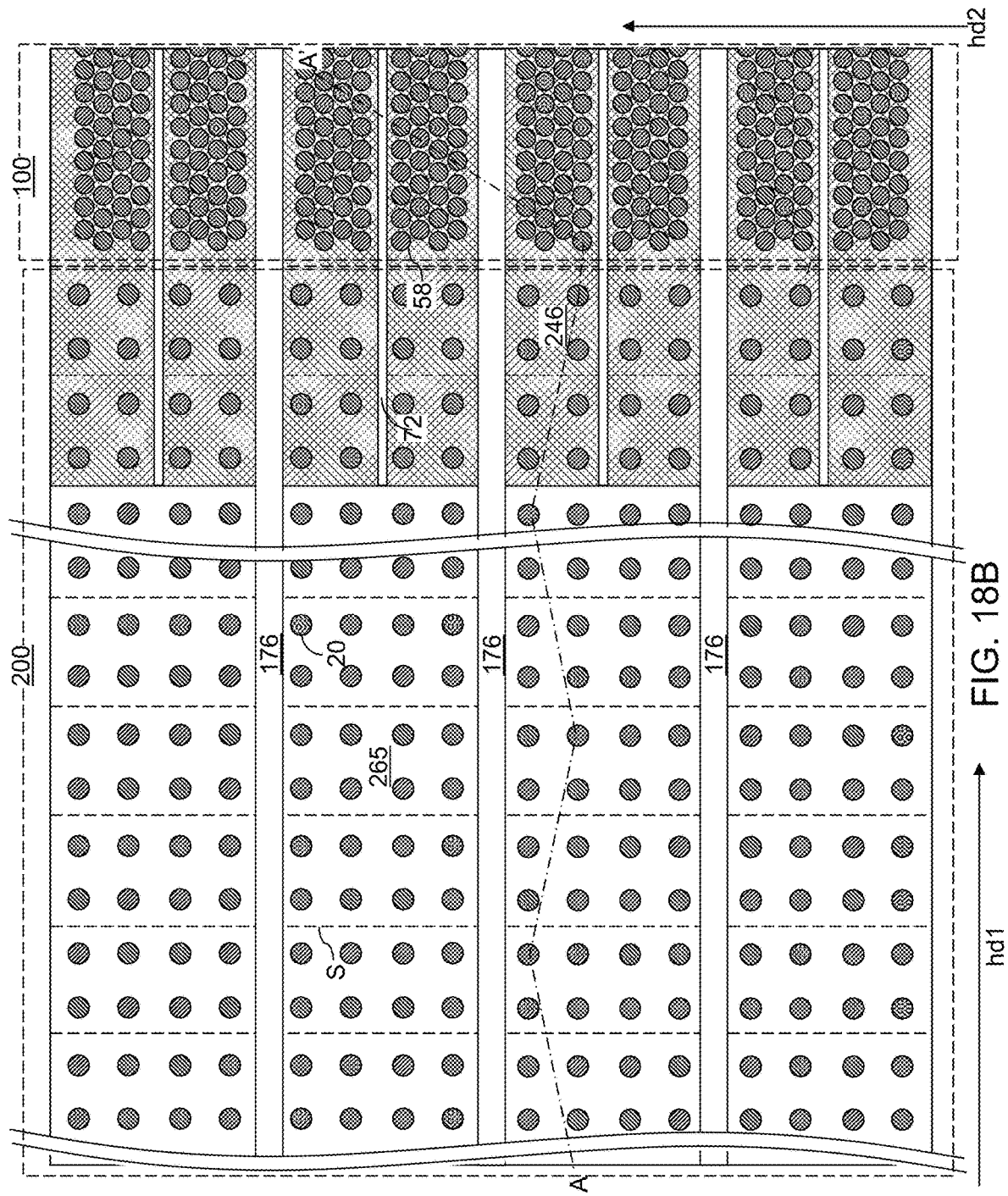
FIG. 18B is a horizontal cross-sectional view of the exemplary structure along the horizontal plane B-B' of FIG. 18A. The hinged vertical plane A-A' corresponds to the plane of the vertical cross-sectional view of FIG. 18A.

Referring to FIGS. 18A and 18B, a dielectric fill material layer may be conformally deposited in the backside trenches 79 and over the first contact-level dielectric layer 280 by a conformal deposition process. The dielectric fill material layer may include, for example, silicon oxide. Each vertically-extending portion of the dielectric fill material layer filling a respective one of the backside trenches 79 constitutes a backside trench fill structure 176. The horizontally-extending portion of the dielectric fill material layer that overlies the first contact-level dielectric layer 280 constitutes a second contact-level dielectric layer 282. The second contact-level dielectric layer 282 may have a thickness in a range from 100 nm to 600 nm, although lesser and greater thicknesses may also be used.

Figure 19A:
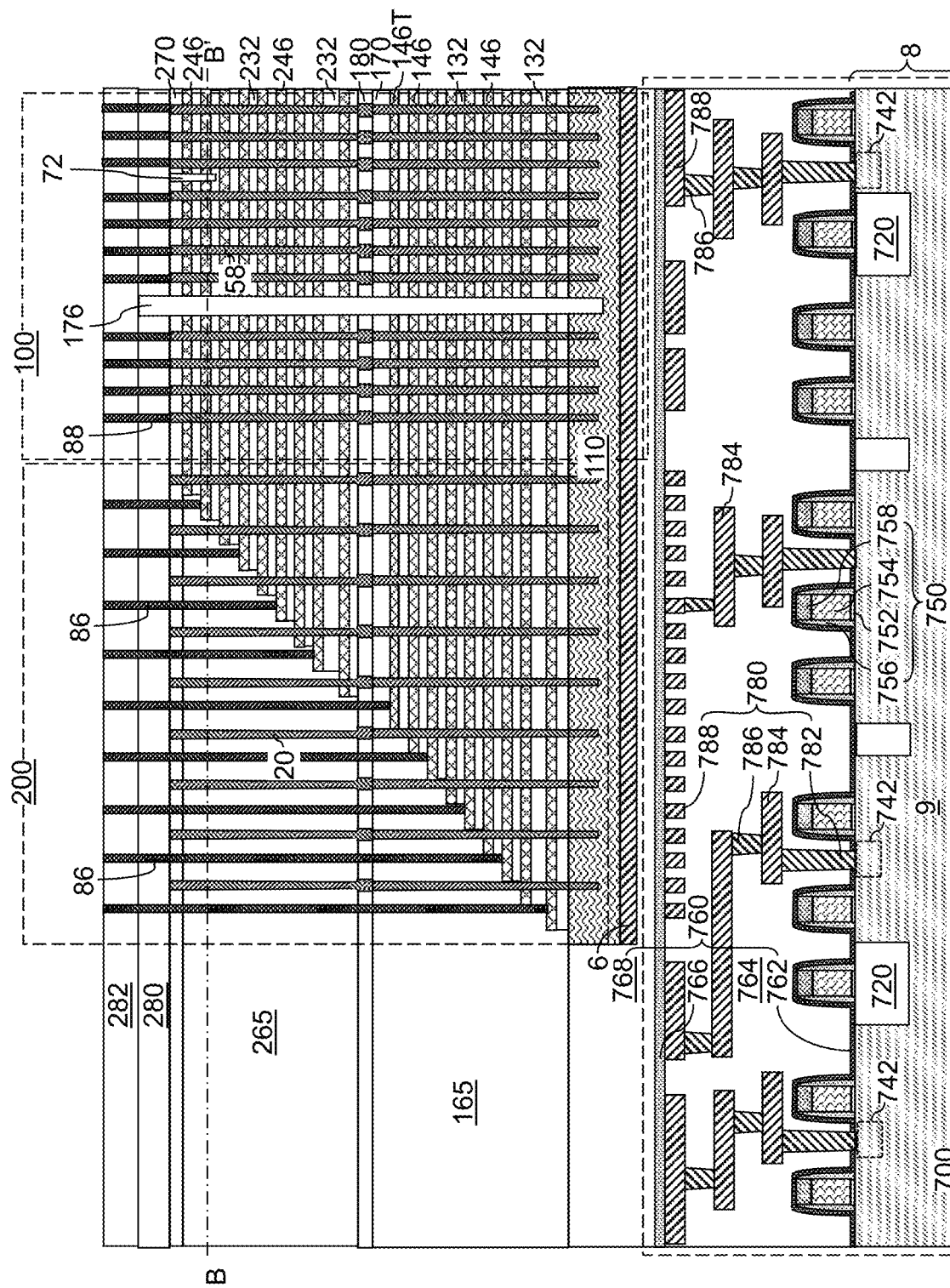
FIG. 19A is a vertical cross-sectional view of the exemplary structure after formation of a second contact-level dielectric layer and various contact via structures according to an embodiment of the present disclosure.
Figure 19B:
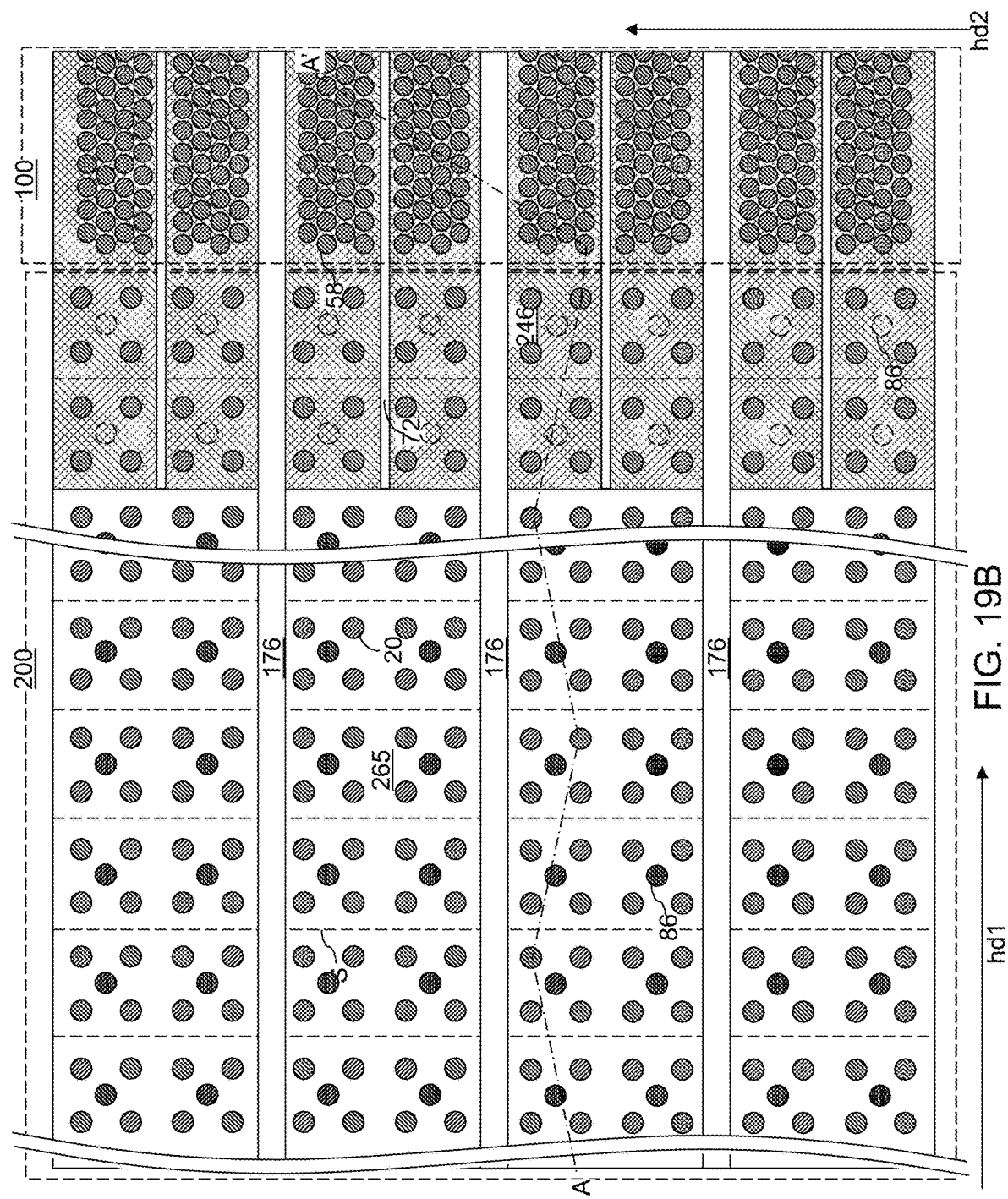
FIG. 19B is a horizontal cross-sectional view of the exemplary structure along the vertical plane B-B' of FIG. 19A. The hinged vertical plane A-A' corresponds to the plane of the vertical cross-sectional view of FIG. 19A.

Referring to FIGS. 19A and 19B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 20:
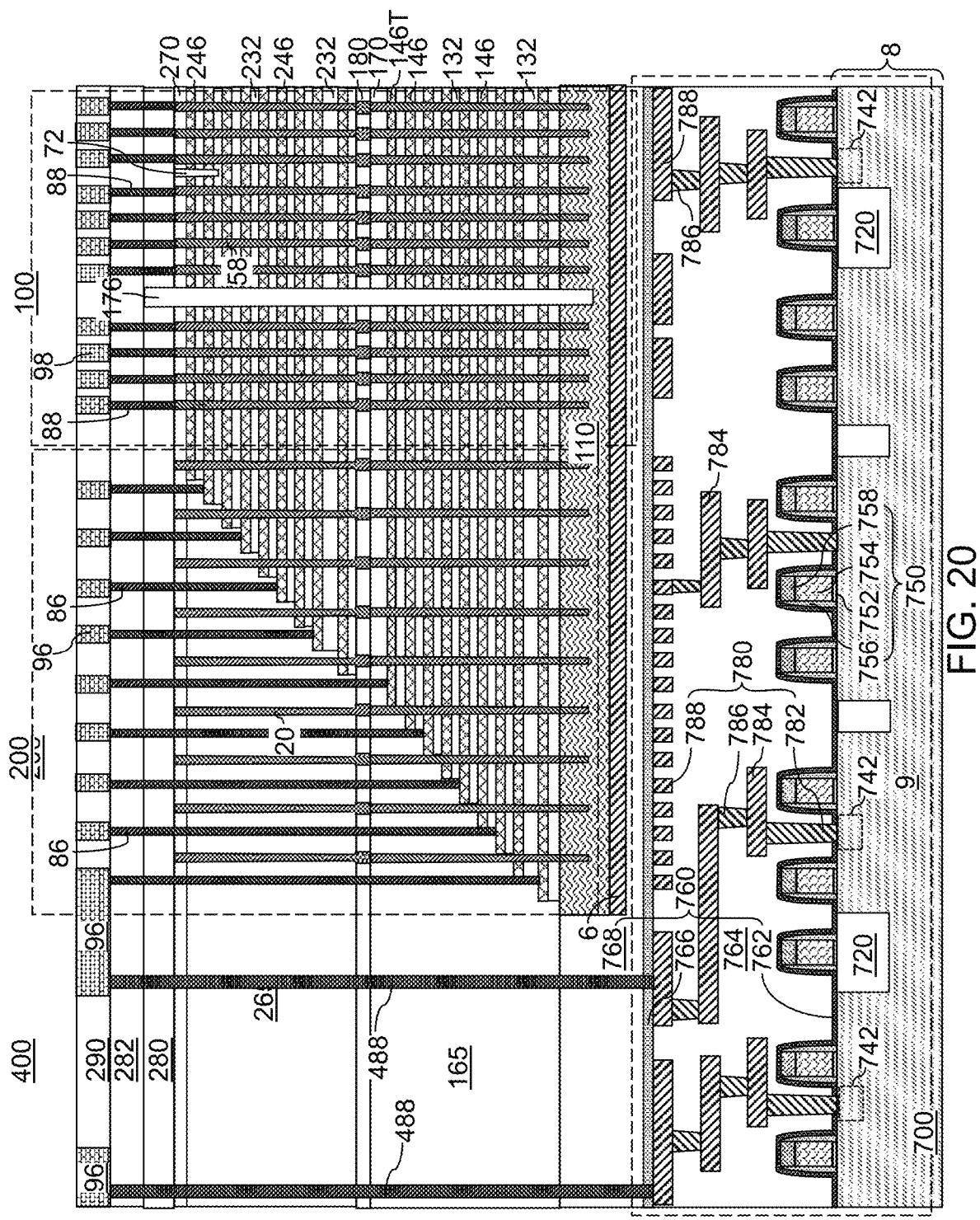
FIG. 20 is a vertical cross-sectional view of the exemplary structure after formation of through-memory-level via structures and upper metal line structures according to an embodiment of the present disclosure.

Referring to FIG. 20 peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in the peripheral device region 400. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

FIGS. 21A-21D are sequential vertical cross-sectional views of a region including of a first-tier memory opening in a first alternative configuration of the exemplary structure during formation of a memory opening fill structure according to an embodiment of the present disclosure.

Figures 21A, 21B:
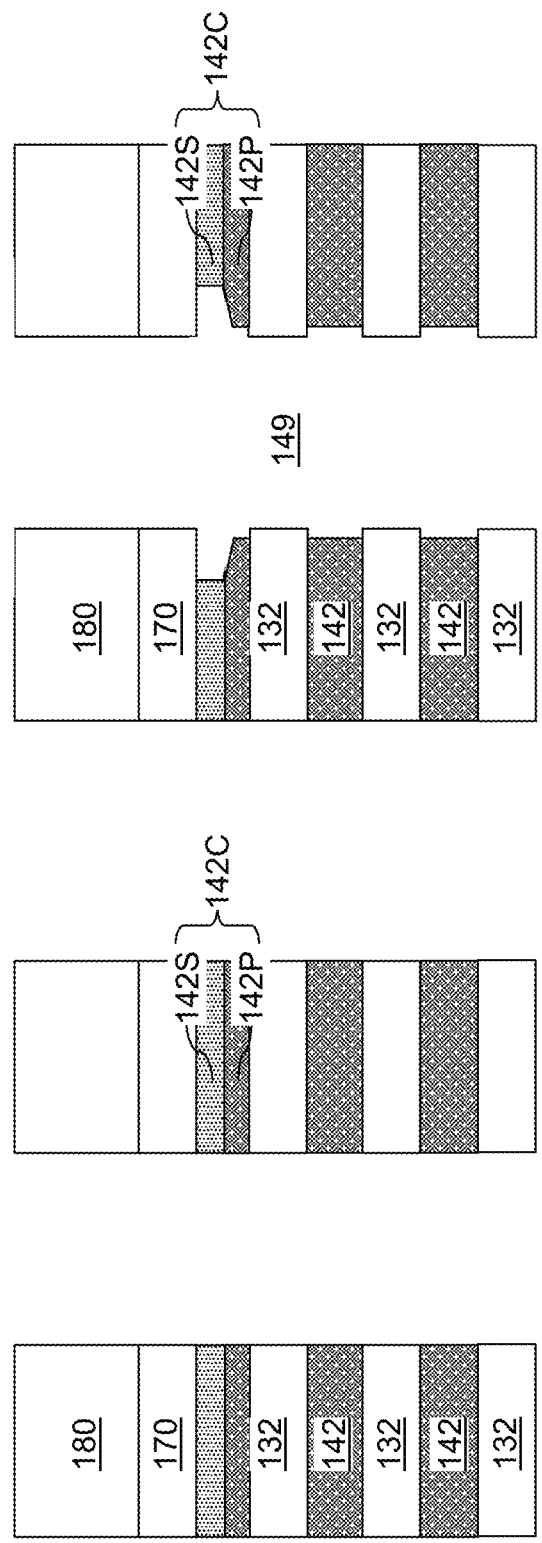
FIGS. 21A-21D are sequential vertical cross-sectional views of a region including of a first-tier memory opening in a first alternative configuration of the exemplary structure during formation of a memory opening fill structure according to an embodiment of the present disclosure.

Referring to FIG. 21A, the first alternative configuration of the exemplary structure is illustrated, which can be derived from the first exemplary structure illustrated in FIG. 5A by forming the secondary sacrificial material sublayer 142S as a material layer having a homogeneous material composition. In other words, the second sacrificial material of the second sacrificial material sublayer 142S can be formed without a gradient in material composition.

Referring to FIG. 21B, the processing steps of FIG. 5B can be performed. The isotropic recess etch process isotropically etches the first sacrificial material and the second sacrificial material selective to the insulating material of the first insulating layers 132 and optionally selective to the materials of the first insulating cap layer 170 and the inter-tier dielectric layer 180 can be performed. The isotropic etch rate etches the second sacrificial material at a higher etch rate than the first sacrificial material. Since the etch rate of the second sacrificial material is uniform, the average etch rate for the second sacrificial material is the uniform etch rate of the second sacrificial material. In an illustrative example, the second sacrificial material may comprise a silicon nitride material having a lower density than the first sacrificial material.

The composite sacrificial material layer 142C is patterned into a taper-containing sacrificial material layer comprising a contoured sidewall having a tapered sidewall segment. In one embodiment, the recessed sidewall of the composite sacrificial material layer 142C may comprise a tapered recessed surface segment. Specifically, a surface segment of the primary sacrificial material sublayer 142P that is adjoined to a cylindrical recessed vertical sidewall of the secondary sacrificial material sublayer 142S may comprise the tapered recessed sidewall segment, which can be a tapered annular surface segment. The tapered annular surface segment can have an inner periphery that is vertically offset from an outer periphery by a vertical offset distance and laterally offset from the outer periphery by a lateral offset distance. Further, the recessed sidewall of the composite sacrificial material layer 142C may comprise a first cylindrical vertical surface segment that is adjoined to the inner periphery of the tapered recessed surface segment, and a second cylindrical vertical surface segment that is adjoined to the outer periphery of the tapered recessed surface segment. The first cylindrical vertical surface segment may be a recessed sidewall segment of the primary sacrificial material sublayer 142P, and the second cylindrical vertical surface segment may be a recessed sidewall segment of the secondary sacrificial material layer 142S. In one embodiment, the vertical offset distance may be in a range from 10% to 50% of a vertical thickness of the taper-containing sacrificial material layer.

Figure 21C:
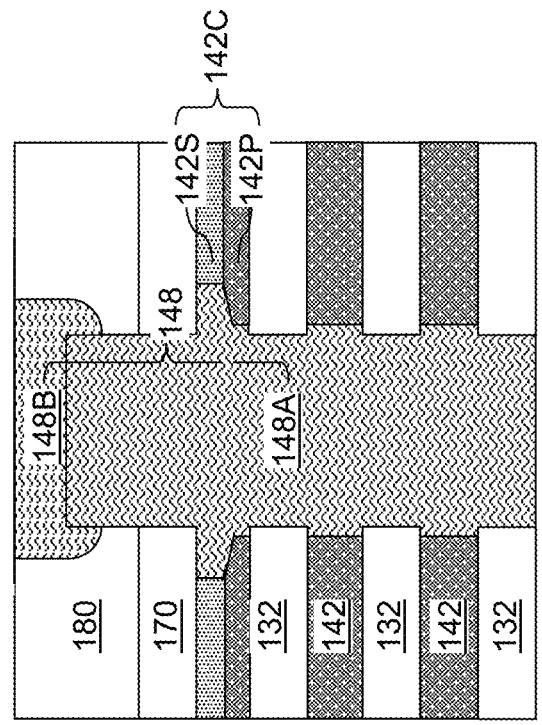

Referring to FIG. 21C, the processing steps of FIGS. 5C, 5D, and 5E may be performed. A first sacrificial memory opening fill portion 148A can be formed within each first-tier memory opening 149.

Figure 21D:
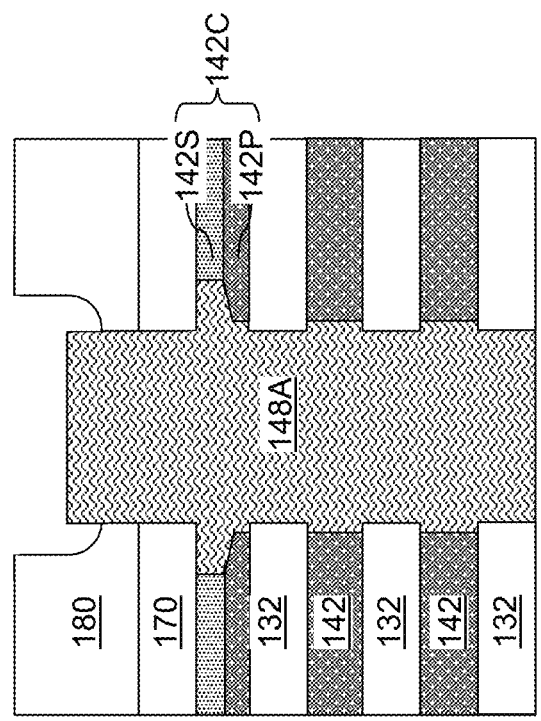

Referring to FIG. 21D, the processing steps of FIG. 5F can be performed to form a second sacrificial memory opening fill portion 148B in an upper portion of each first-tier memory opening 149.

Figure 22:
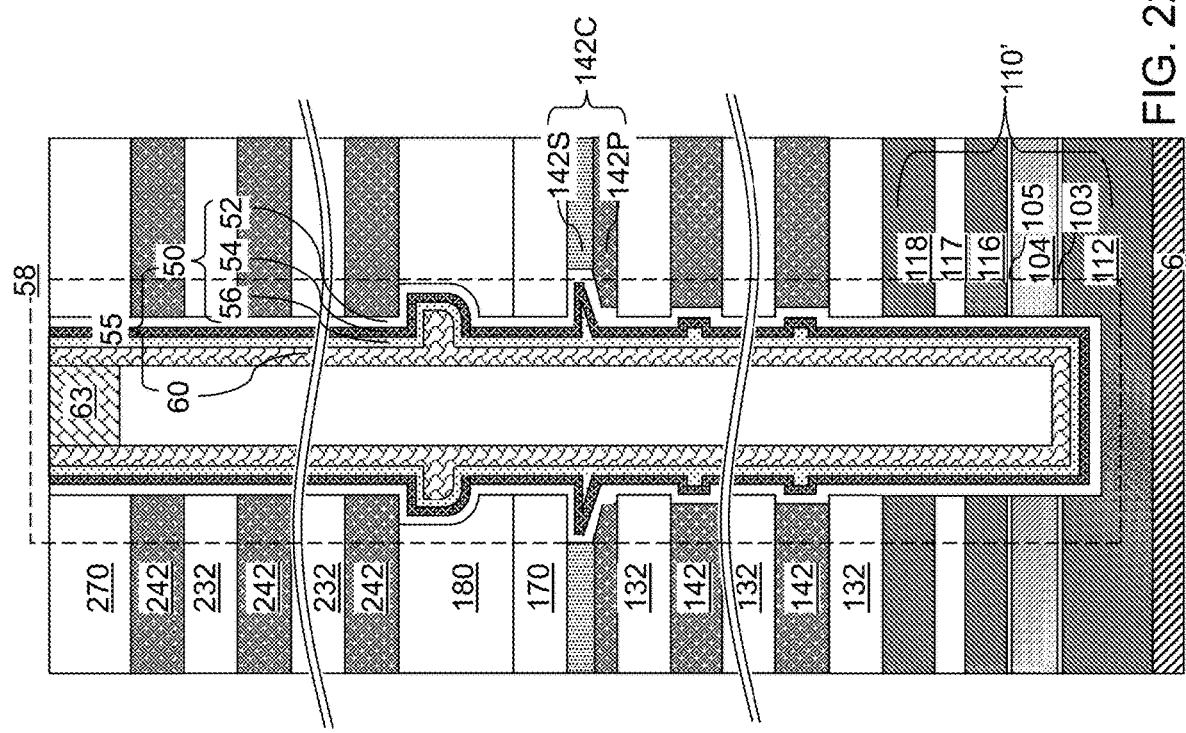
FIG. 22 is a vertical cross-sectional view of a region including a memory opening fill structure in the first alternative configuration of the exemplary structure after formation of a memory opening fill structure according to an embodiment of the present disclosure.

Referring to FIG. 22, the processing steps of FIGS. 7, 8A-8C, 9, and 10A-10D can be performed to form a memory opening fill structure 58 in each memory opening 49.

Figure 23:
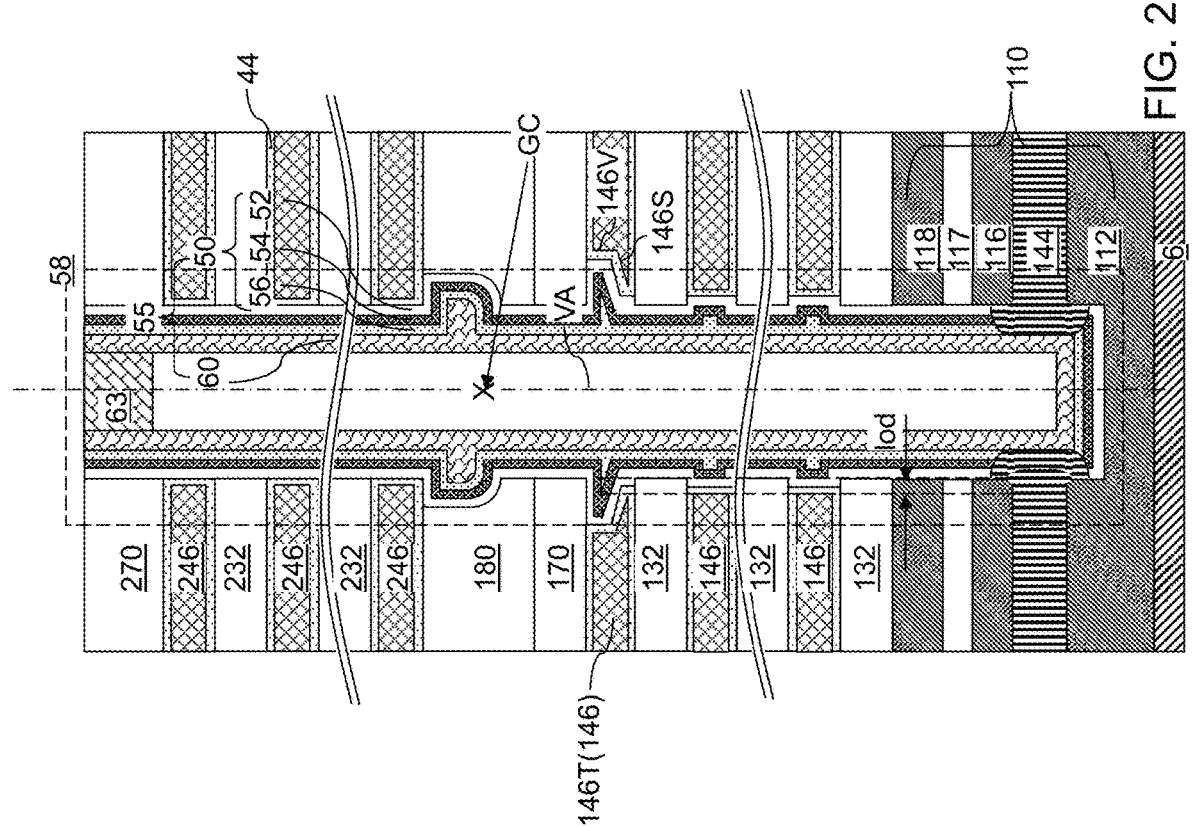
FIG. 23 is a vertical cross-sectional view of a region including a memory opening fill structure in the first alternative configuration of the exemplary structure after formation of electrically conductive layers according to an embodiment of the present disclosure.

Referring to FIG. 23, the processing steps of FIGS. 12A and 12B, 13, 14A-14E, 15, 16A and 16B, 17A-17C, 18A and 18B, 19A and 19B, and 20 can be performed. In the first alternative configuration of the exemplary structure, the inner periphery of the annular tapered sidewall segment 146S of the taper-containing electrically conductive layer 146T can be adjoined to a closed periphery of a horizontal surface of the taper-containing electrically conductive layer 146T, and the outer periphery of the annular tapered sidewall segment is adjoined to a bottom periphery of a vertical cylindrical sidewall segment 146V of the taper-containing electrically conductive layer 146T.

Figure 24:
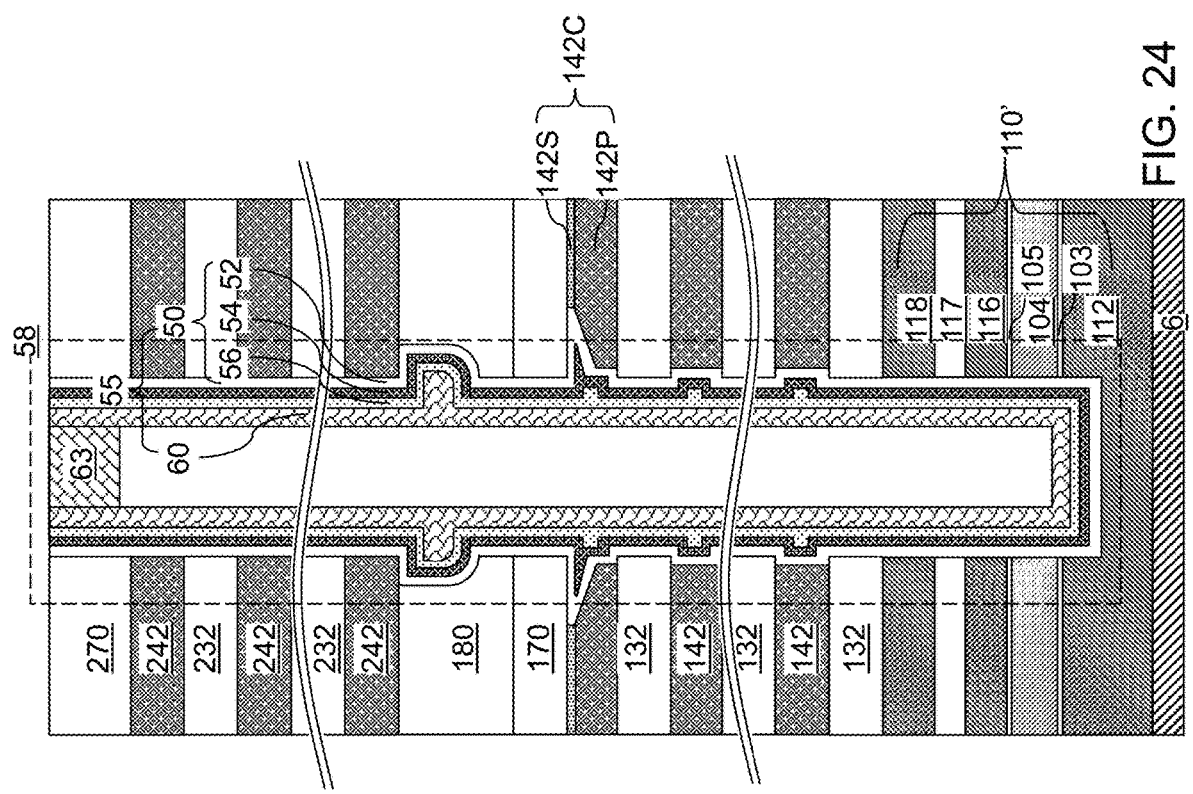
FIG. 24 is a vertical cross-sectional view of a region including a memory opening fill structure in a second alternative configuration of the exemplary structure after formation of a memory opening fill structure according to an embodiment of the present disclosure.

Referring to FIG. 24, a second alternative configuration of the exemplary structure is illustrated at a processing step that corresponds to the processing step of FIG. 10D. The second alternative configuration of the exemplary structure can be derived from the first alternative configuration of the exemplary structure by increasing the thickness of the primary sacrificial material sublayer 142P relative to the secondary sacrificial material sublayer 142S.

Figure 25:
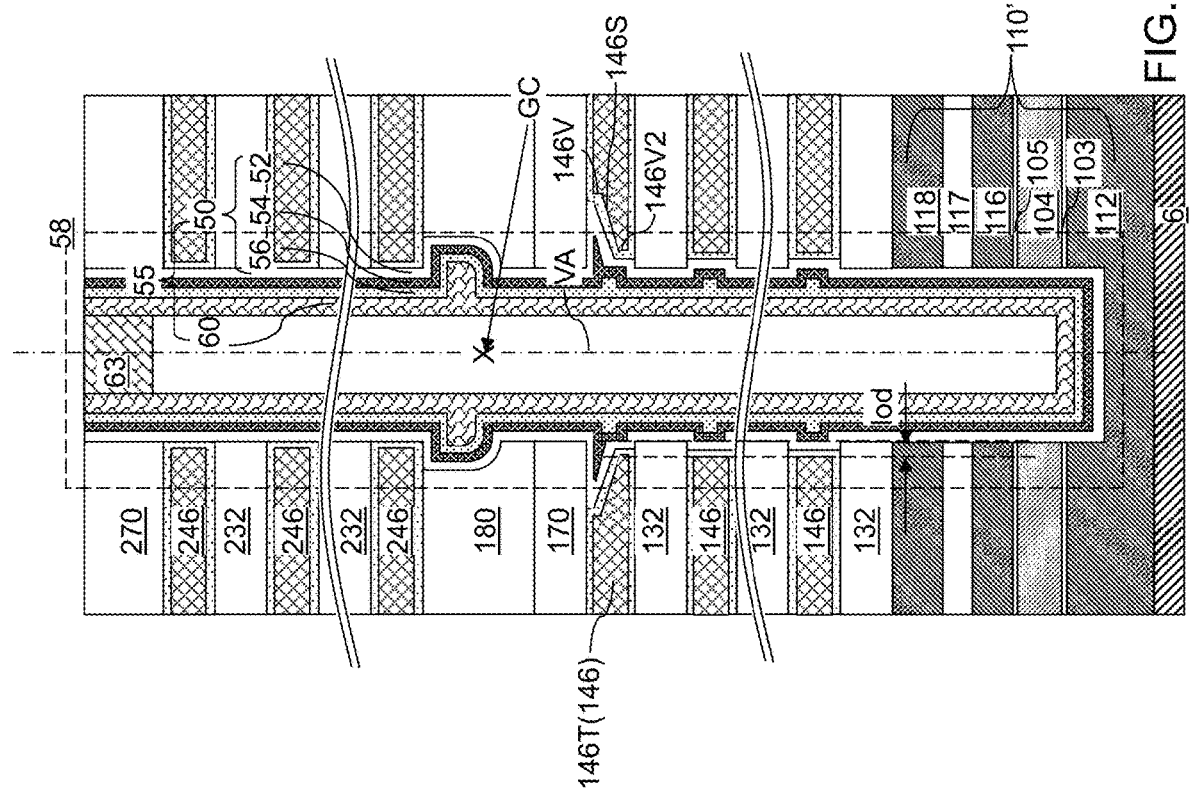
FIG. 25 is a vertical cross-sectional view of a region including a memory opening fill structure in the second alternative configuration of the exemplary structure after formation of electrically conductive layers according to an embodiment of the present disclosure.

Referring to FIG. 25, the second alternative configuration of the exemplary structure is illustrated at a processing that corresponds to the processing step of FIG. 20. In one embodiment, the contoured sidewall of the taper-containing electrically conductive layer 146T around each memory opening fill structure 58 may comprise a first vertical straight cylindrical sidewall segment 146V that is adjoined to the outer periphery of the annular tapered sidewall segment 146S. In one embodiment, the contoured sidewall 146S further comprises a second vertical straight cylindrical sidewall segment 146V2 that is adjoined to the inner periphery of the annular tapered sidewall segment 146S. In one embodiment, the inner periphery of the annular tapered sidewall segment 146S of the taper-containing electrically conductive layer 146T is adjoined to a top periphery of the second vertical straight cylindrical sidewall segment 146V2 of the taper-containing electrically conductive layer 146T, and the outer periphery of the annular tapered sidewall segment 146S is adjoined to a bottom periphery of the first vertical straight cylindrical sidewall segment 146V of the taper-containing electrically conductive layer 146T.

Referring to all drawings and according to various embodiments of the present disclosure, a memory device is provided, which comprises: a first alternating stack of first insulating layers 132 and first electrically conductive layers 146; a memory opening 49 vertically extending through the first alternating stack (132, 146); and a memory opening fill structure 58 located in the memory opening 49 and comprising a vertical stack of memory elements and a vertical semiconductor channel 60. The memory opening fill structure 58 comprises a lateral protrusion 58T having a tapered sidewall surface 58S. One of the first electrically conductive layers 146 comprises a taper-containing electrically conductive layer 146T that is located at a level of the lateral protrusion 58T of the memory opening fill structure 58 and comprises a contoured sidewall having a tapered sidewall segment 146S that is parallel to the tapered sidewall surface 58S of the lateral protrusion 58T.

In one embodiment, the taper-containing electrically conductive layer 146T comprises a dummy word line. In one embodiment, the tapered sidewall segment 146S is an annular tapered sidewall segment having an inner periphery that is vertically offset from an outer periphery by a vertical offset distance. In one embodiment, the vertical offset distance is in a range from 10% to 100% of a vertical thickness of the taper-containing electrically conductive layer 146T. In one embodiment, the inner periphery of the annular tapered sidewall segment 146S is adjoined to a first closed periphery of a first horizontal surface of the taper-containing electrically conductive layer 146T; and the outer periphery of the annular tapered sidewall segment 146S is adjoined to a second closed periphery of a second horizontal surface of the taper-containing electrically conductive layer 146T.

In one embodiment shown in FIG. 23, the contoured sidewall comprises a first vertical straight cylindrical sidewall segment 146V that is adjoined to the outer periphery of the annular tapered sidewall segment 146S. In one embodiment, the contoured sidewall further comprises a second vertical straight cylindrical sidewall segment 146V2 that is adjoined to the inner periphery of the annular tapered sidewall segment 146S. In one embodiment, the inner periphery of the annular tapered sidewall segment 146S is adjoined to a closed periphery of a horizontal surface of the taper-containing electrically conductive layer 146T.

In one embodiment, the inner periphery of the tapered sidewall segment 146S is laterally offset outward from a cylindrical sidewall of a first insulating layer that is most proximal to the taper-containing electrically conductive layer 146T of the first insulating layers 132 by a uniform lateral offset distance 1od. In one embodiment, each of the first electrically conductive layers 146 except the taper-containing electrically conductive layer 146T comprises a respective vertical cylindrical sidewall that is laterally offset from a respective most proximal underlying first insulating layer 132 of the first insulating layers 132 by the uniform lateral offset distance 1od.

In one embodiment, the memory opening fill structure 58 comprises a memory film 50 including a tunneling dielectric layer 56, the vertical stack of memory elements (as embodied as portions of a charge storage layer 54 located at the levels of the electrically conductive layers (146, 246), and a blocking dielectric layer 52; and an entirety volume of the lateral protrusion of the memory opening fill structure 58 is filled with the memory film 50.

In one embodiment, the memory device further comprises a source layer (112, 114, 116) located between the substrate 8 and the first alternating stack (132, 146) and contacting a bottom end of the memory film 50 and contacting the vertical semiconductor channel 60.

In one embodiment, a portion of an outer sidewall of the memory film that vertically extends through the first alternating stack (132, 146) has a contoured vertical cross-sectional profile in which segments of the outer sidewall of the memory film 50 located at levels of the first electrically conductive layers 146 laterally protrude farther outward from a vertical axis VA passing through a geometrical center GC of the memory opening fill structure 58 than segments of the outer sidewall of the memory film 50 contacting sidewalls of the first insulating layers 132.

In one embodiment, memory device comprises a second alternating stack of second insulating layers 232 and second electrically conductive layers 246 overlying the first alternating stack (132, 146), wherein the memory opening fill structure 58 vertically extends through the second alternating stack (232, 246).

In one embodiment, a portion of the outer sidewall of the memory film 50 that vertically extends through the second alternating stack (232, 246) has a straight vertical cross-sectional profile that extends from a bottommost layer within the second alternating stack (232, 246) to a topmost layer within the alternating stack (232, 246).

In one embodiment, the dummy word line 146T is located adjacent to a joint region between the first alternating stack and the second alternating stack.

The electric field at the vertical channel 60 facing edge of the taper-containing dummy word line 146T is reduced due to the presence of the tapered sidewall segment 146S. The reduced electric field reduces back tunneling and provides an improved deep erase depth. Thus, the starting erase voltage for back tunneling is increased and the device erase efficiency is improved by forming the taper-containing dummy word line 146T.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
    forming a first alternating stack of first insulating layers and first sacrificial material layers located over a substrate, wherein one of the first sacrificial material layers comprises a composite sacrificial material layer including a primary sacrificial material sublayer including a first sacrificial material and a secondary sacrificial material sublayer including a second sacrificial material that is different from the first sacrificial material;
    forming a first-tier memory opening through the first alternating stack;
    performing an isotropic recess etch process that isotropically etches the second sacrificial material at a higher average etch rate than the first sacrificial material, wherein a recessed sidewall of the composite sacrificial material layer comprises a tapered recessed surface segment; and
    forming a memory opening fill structure within a volume including the first-tier memory opening, wherein the memory opening fill structure comprises a vertical stack of memory elements and a vertical semiconductor channel, and comprises a lateral protrusion having a tapered sidewall surface that is parallel to the tapered recessed surface segment.

2. The method of claim 1, further comprising replacing the first sacrificial material layers with first electrically conductive layers, wherein one of the first electrically conductive layers comprises a taper-containing electrically conductive layer that is formed in a volume from which the composite sacrificial material layer is removed.

3. The method of claim 2, wherein the taper-containing electrically conductive layer comprises a dummy word line having a contoured sidewall having a tapered sidewall segment that is parallel to the tapered sidewall surface of the lateral protrusion.

4. The method of claim 1, wherein the recessed sidewall of the composite sacrificial material layer comprises a cylindrical vertical surface segment that is adjoined to the tapered recessed surface segment.

5. The method of claim 1, wherein:
    the first sacrificial material comprises a first silicon nitride material; and
    the second sacrificial material comprises a second silicon nitride material having a higher average etch rate during the isotropic recess etch process than an etch rate of the first sacrificial material during the isotropic recess etch process.

6. The method of claim 1, further comprising:
    forming a second alternating stack of second insulating layers and second sacrificial material layers over the first alternating stack;
    forming a second-tier memory opening through the second alternating stack over a volume of the first-tier memory opening;
    forming an inter-tier memory opening including volumes of the second-tier memory opening and the first-tier memory opening, wherein the memory opening fill structure is formed within the inter-tier memory opening; and
    replacing the first sacrificial material layers and the second sacrificial material layers with first electrically conductive layers and second electrically conductive layers, respectively.

* * * * *